US009673802B2

(12) United States Patent
Granger-Jones et al.

(10) Patent No.: US 9,673,802 B2
(45) Date of Patent: Jun. 6, 2017

(54) HIGH POWER FET SWITCH

(75) Inventors: Marcus Granger-Jones, Scotts Valley, CA (US); Christian Rye Iversen, Vestbjerg (DK)

(73) Assignee: Qorvo US, Inc., Greensboro, NC (US)

( * ) Notice: Subject to any disclaimer, the term of this patent is extended or adjusted under 35 U.S.C. 154(b) by 605 days.

(21) Appl. No.: 13/095,302

(22) Filed: Apr. 27, 2011

(65) Prior Publication Data

US 2011/0260773 A1 Oct. 27, 2011

Related U.S. Application Data

(60) Provisional application No. 61/328,384, filed on Apr. 27, 2010.

(51) Int. Cl.
H03K 17/10 (2006.01)
(52) U.S. Cl.
CPC .................. H03K 17/102 (2013.01)
(58) Field of Classification Search
CPC ..................................................... H03K 17/102
USPC ........................................ 327/427, 530, 534
See application file for complete search history.

(56) References Cited

U.S. PATENT DOCUMENTS

| 4,890,077 | A  | * | 12/1989 | Sun ............................ 333/81 A |
|-----------|----|---|---------|------------------------------------------|
| 5,617,055 | A  |   | 4/1997  | Confalonieri et al.                      |
| 6,094,088 | A  |   | 7/2000  | Yano                                     |
| 6,803,680 | B2 | * | 10/2004 | Brindle et al. ................ 307/115  |
| 7,026,858 | B2 |   | 4/2006  | Tosaka                                   |
| 7,106,121 | B2 |   | 9/2006  | Hidaka et al.                            |
| 7,250,804 | B2 | * | 7/2007  | Brindle .......................... 327/365 |
| 7,268,613 | B2 |   | 9/2007  | Cranford, Jr. et al.                     |
| 7,679,417 | B2 |   | 3/2010  | Vice                                     |
| 7,843,280 | B2 |   | 11/2010 | Ahn et al.                               |
| 7,848,712 | B2 |   | 12/2010 | Fu et al.                                |
| 8,044,739 | B2 |   | 10/2011 | Rangarajan et al.                        |
| 8,058,922 | B2 |   | 11/2011 | Cassia                                   |
| 8,093,940 | B2 |   | 1/2012  | Huang et al.                             |
| 8,330,519 | B2 |   | 12/2012 | Lam et al.                               |
| 8,779,840 | B2 |   | 7/2014  | Sugiura et al.                           |
| 2001/0040479 | A1 |   | 11/2001 | Zhang                                 |

(Continued)

OTHER PUBLICATIONS

Kelly, D. et al., "The state-of-the-art of silicon-on-sapphire CMOS RF switches," 2005 IEEE Compound Semiconductor Integrated Circuity Symposium, Oct. 30-Nov. 2, 2005, pp. 200-203, IEEE.

(Continued)

*Primary Examiner* — Lincoln Donovan
*Assistant Examiner* — Colleen O Toole
(74) *Attorney, Agent, or Firm* — Withrow & Terranova, P.L.L.C.

(57) ABSTRACT

Described are embodiments of stacked field effect transistor (FET) switch having a plurality of FET devices coupled in series to form an FET device stack. To prevent the FET device stack from being turned on during large signal conditions, one or more decoupling paths are provided and are configured to pass the time-variant input signal during the open state of the FET device stack. The first decoupling path may include a capacitor, a transistor, or the like, that passes the time-variant input signal by, for example, presenting a low impedance to the time-variant input signal during the open state. The decoupling paths may be connected so that the time-variant input signal bypasses a portion of the FET device stack during the open state.

24 Claims, 10 Drawing Sheets

(56) References Cited

U.S. PATENT DOCUMENTS

| | | | |
|---|---|---|---|
| 2002/0043991 A1 | 4/2002 | Nishitoba | |
| 2007/0139094 A1* | 6/2007 | Nakatsuka et al. | 327/430 |
| 2009/0212843 A1 | 8/2009 | Deboy | |
| 2010/0214009 A1* | 8/2010 | Fechner | 327/534 |

OTHER PUBLICATIONS

Shifrin, M.B. et al., "Monolithic FET structures for high-power control component applications," IEEE Transactions on Microwave Theory and Techniques, Dec. 1989, pp. 2134-2141, vol. 37, No. 12, IEEE.
Tinella, C. et al., "0.13/spl mu/m CMOS SOI SP6T antenna switch for multi-standard handsets," 2006 Topical Meeting on Silicon Monolithic Integrated Circuits in RF Systems, Jan. 18-20, 2006, pp. 58-61, IEEE.
Supplemental Notice of Allowance for U.S. Appl. No. 13/095,357, mailed Jun. 21, 2013, 4 pages.
Non-Final Office Action for U.S. Appl. No. 13/095,357, mailed Aug. 7, 2013, 7 pages.
Sonnerat, F. et al., "4G Antenna Tuner Integrated in a 130 nm CMOS SOI Technology", 2012 IEEE 12th Topical Meeting on Silicon Monolithic Integrated Circuits in RF Systems (SiRF), Jan. 16-18, 2012, pp. 191-194.
Non-Final Office Action for U.S. Appl. No. 13/095,357, mailed Aug. 6, 2012, 8 pages.
Final Office Action for U.S. Appl. No. 13/095,357, mailed Jan. 2, 2013, 8 pages.
Advisory Action for U.S. Appl. No. 13/095,357, mailed Mar. 8, 2013, 3 pages.
Notice of Allowance for U.S. Appl. No. 13/095,357, mailed Apr. 5, 2013, 7 pages.
Non-Final Office Action for U.S. Appl. No. 13/095,410, mailed Nov. 8, 2012, 13 pages.
Final Office Action for U.S. Appl. No. 13/095,410, mailed Feb. 14, 2013, 15 pages.
Advisory Action for U.S. Appl. No. 13/095,410, mailed Jun. 19, 2013, 3 pages.
Final Office Action for U.S. Appl. No. 13/095,357, mailed Jan. 7, 2014, 9 pages.
Non-Final Office Action for U.S. Appl. No. 13/095,410, mailed Feb. 3, 2014, 15 pages.
Advisory Action for U.S. Appl. No. 13/095,357, mailed Mar. 20, 2014, 2 pages.
Non-Final Office Action for U.S. Appl. No. 13/922,337, mailed Mar. 10, 2014, 11 pages.
Final Office Action for U.S. Appl. No. 13/095,410, mailed May 27, 2014, 15 pages.
Non-Final Office Action for U.S. Appl. No. 13/095,410, mailed Apr. 28, 2015, 15 pages.
Notice of Allowance for U.S. Appl. No. 13/922,337, mailed Aug. 3, 2015, 7 pages.
Final Office Action for U.S. Appl. No. 13/095,410, mailed Nov. 6, 2015, 15 pages.
Advisory Action for U.S. Appl. No. 13/095,410, mailed Feb. 4, 2016, 3 pages.
Non-Final Office Action for U.S. Appl. No. 13/095,410, mailed Apr. 13, 2016, 14 pages.
Notice of Allowance for U.S. Appl. No. 13/095,357, mailed Oct. 23, 2014, 7 pages.
Advisory Action for U.S. Appl. No. 13/095,410, mailed Sep. 25, 2014, 3 pages.
Final Office Action for U.S. Appl. No. 13/922,337, mailed Nov. 4, 2014, 10 pages.
Final Office Action for U.S. Appl. No. 13/095,410, mailed Oct. 21, 2016, 15 pages.
Advisory Action for U.S. Appl. No. 13/095,410, mailed Dec. 29, 2016, 3 pages.
Non-Final Office Action U.S. Appl. No. 13/095,410, mailed Apr. 14, 2017, 17 pages.

\* cited by examiner

HIGH POWER FET SWITCH

RELATED APPLICATIONS

This application claims the benefit of provisional patent application Ser. No. 61/328,384 entitled "SINGLE SUPPLY GROUND, AC COUPLED STACKED HIGH POWER FET SWITCH, SINGLE SUPPLY AC COUPLED STACKED HIGH POWER FET SWITCH, AND SINGLE SUPPLY STACKED HIGH POWER FET SWITCH," filed Apr. 27, 2010, the disclosure of which is hereby incorporated herein by reference in its entirety. This application is related to U.S. Utility patent application Ser. No. 13/095,357, now U.S. Pat. No. 8,970,278, also entitled "HIGH POWER FET SWITCH," filed concurrently with this application on Apr. 27, 2011; and U.S. Utility patent application Ser. No. 13/095,410, also entitled "HIGH POWER FET SWITCH," filed concurrently with this application on Apr. 27, 2011, the disclosure of which is incorporated herein by reference in its entirety.

FIELD OF THE DISCLOSURE

This disclosure relates to field effect transistor (FET) switches and methods of operating the same. More particularly, the disclosure relates to stacked FET switches and methods of operating the same.

BACKGROUND

A prior art stacked field effect transistor (FET) switch 10 connected to an RF line 12 is depicted in FIG. 1. The stacked FET switch 10 has an FET device stack 14 that is formed by a plurality of FET devices 16 coupled in series. Each of the plurality of FET devices 16 includes a drain contact, D, a source contact, S, a gate contact, G, and a body contact, B. When the FET device stack 14 operates in a closed state, the FET device stack 14 presents a low impedance to the RF line 12. This provides a shunt path for a radio frequency (RF) signal 18 to ground. On the other hand, when the FET device stack operates in the open state, a high impedance is presented to the RF line 12 and thus, theoretically, the FET device stack 14 does not conduct any of the time-variant RF signal 18. Of course, in practice, some leakage currents are conducted through the FET device stack 14 during the open state, but generally are low enough so as to be negligible. By stacking the plurality of FET devices 16, the time-variant RF signal 18 can be distributed across the plurality of FET devices 16 of the FET device stack 14 allowing the FET device stack 14 to handle higher voltage RF signals 18.

To provide the appropriate biasing voltages for operating the FET device stack 14, the stacked FET switch 10 includes a prior art control circuit 20 having a DC voltage source 22, a negative voltage generator 24, a plurality of switches 26A, 26B, 26C, 26D, and 26E (referred to collectively as "switches 26"), and a bias control device 28 that controls the switches 26. The bias control device 22 controls the plurality of switches 26 to bias a gate voltage at gate contacts and a body voltage at the body contacts, B, in accordance with Table I below.

| Switch State | Gate Voltage | Body Voltage |
|---|---|---|
| Open State | $-V_{bias}$ | $-V_{bias}$ |
| Transition State 1 | Ground | $-V_{bias}$ |
| Transition State 2 | Ground | Ground |
| Closed State | $+V_{bias}$ | Ground |

The drain and sources contacts, D, S, of the FET devices 16 are biased at ground or possibly at an RF port that provides a reference voltage during both the open state and the closed state. The voltage at the drain and sources contacts, D, S, does not change with respect the reference voltage. However, by biasing the gate contacts, G, at the voltage $-V_{bias}$, the channels of the FET devices 16 are pinched off and a buffer voltage is provided that ensures that the time-variant RF signal 18 does not turn on the plurality of FET devices 16 during the open state. To prevent reverse bias diodes from being formed between the body of each of the plurality of FET devices 16 and the drain and sources of each of the plurality of FET devices 16, the body contacts are also biased at the voltage $-V_{bias}$.

One of the problems with this approach is that it requires a negative voltage generator 24 to maintain the gate contacts, G, at the negative bias voltage $-V_{bias}$ relative to ground during the open state. The negative voltage generator 24 may be implemented using negative charge pumps that add additional complexity to the control circuit 20 and may generate spurs. Furthermore, an additional DC voltage source 22 is required to provide a positive bias, $+V_{bias}$, to the gate contacts, G, and operate the FET device stack 14 in a closed state, which also adds complexity to the control circuit 20. If the negative voltage generator 24 is implemented by the negative charge pumps, the finite output impedance of the negative charge pumps also causes problems during transitions from different states as connections to the gates and body are charged and discharged.

Another problem with the prior art design is that it requires a bias swing of $|2V_{bias}|$ to turn the FET device stack 14 from the open state to the closed state, and vice versa. During steady state operation, the bias voltage $-V_{bias}$, has been selected so that voltage from the time-variant RF signal 18 does not cause the voltage at the gate contacts to exceed the breakdown voltage, given the maximum and minimum voltage peaks of the time-variant RF signal 18. However, transition states are required so that the voltage between the gate contact, G, and the other drain and source contact, D, S, of the FET devices 16 do not exceed the voltage handling capabilities of the FET devices 16 from the open and closed states. Of course this adds additional complexity to the control circuit 20, as switches 26B-26E and/or logic level shifters, are required to provide the appropriate gate and body voltages during each of these states. These switches 26B-26E of control device 28 must be appropriately timed to avoid stressing the FET devices 16 during these transitions.

In addition, another disadvantage of the prior art design is that the body contacts, B, must also be negatively biased if the plurality of FET devices 16 are the type of FET devices that require body biasing. For example, in certain types of FET devices 16, internal reverse bias diodes are activated between the body contact, B, and the drain and source contracts, D, S during the open state that prevent the FET device stack 14 from operating appropriately. If the internal reverse bias diodes are activated and a bias voltage, $-V_{bias}$, is not provided at the body contacts, B during the open state, then the voltage drop from the drain contact, D, to the source contacts, S, of each of the plurality of FET devices 16 would be limited to the voltage of a reverse bias diode, around 0.6

Volts. Thus, the prior art design requires negatively biasing the body contacts, B, to $-V_{bias}$ so that the reverse biased diodes are not reverse biased (or at least are not significantly reverse biased) during the open state. Also, the body contacts, B, must be transitioned back to ground when the FET device stack 14 operates in the closed state. This requires the control circuit 20 to have switches 26C, 26D and for the bias control device 28 to time these switches 26C, 26D appropriately. Other prior art embodiments use floating body designs and may not include body contacts, B and use self-biasing. However, prior art floating body designs suffer from poor linearity.

Accordingly, there is a need to develop a stacked FET switch with a control circuit that does not require excessive bias swings and negative biasing voltages.

SUMMARY

Embodiments in the detailed description describe a stacked field effect transistor (FET) switch having a plurality of FET devices coupled in series to form an FET device stack. The FET device stack is configured to operate in an open state and in closed state. During the closed state, the plurality of FET devices is turned on and thus a time-variant input signal can be transmitted through the FET device stack. On the other hand, in the closed state, the plurality of FET devices is turned off and the time-variant input signal is blocked from being transmitted through the FET device stack.

Each FET device includes a gate contact, a drain contact, and a source contact. In one embodiment, an FET device in the stack has a source contact at one end of the FET device stack. To prevent the FET device stack from being turned on during large signal conditions, a first decoupling path is provided for one of the end FET device which is configured to pass the time-variant input signal. The first decoupling path may include a capacitor, a transistor, or the like, that passes the time-variant input signal by, for example, presenting a low impedance to the time-variant input signal during the open state. The first decoupling path may be connected to one of the end FET devices so that the time-variant input signal bypasses the FET device stack from the gate contact to the source contact of the end FET device during the open state. Consequently, the time-variant input signal either does not cause a voltage drop during the open state from the gate contact of the end FET device to the source contact of the end FET device or the voltage drop is at least substantially reduced.

By decoupling the end FET device from the gate contact to the source contact with respect to the time-variant input signal during the open state, the end FET device is not turned on during large signal conditions while the FET device stack is operating in the open state. In this manner, any chain reaction which forces one or more of the FET devices to be turned on does not force the FET device stack out of the open state.

Alternatively, the first decoupling path may be connected so that the time-variant input signal bypasses the FET device stack from the drain contact to the source contact of the end FET device. Also, as explained in this disclosure, the first decoupling path may instead be connected to another FET device having a drain contact at the oppositely disposed end of the FET device stack. The first decoupling path may be connected so that the time-variant input signal bypasses the FET device stack from the drain contact to the gate contact or from the drain contact to the source contact of this other end FET device. Embodiments having multiple decoupling paths are also disclosed herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The described devices, systems, and methods include topologies that prevent and/or impede a stacked field effect transistor (FET) switch from being forced out of the open state during large signal conditions. Also, devices, systems, and methods are described that greatly reduce biasing swings caused when a stacked field effect transistor (FET) switch transitions from an open state to a closed state and vice versa. Furthermore, no negative charge pumps are needed to force the negative biasing of FET devices during the open state.

Figure 1:
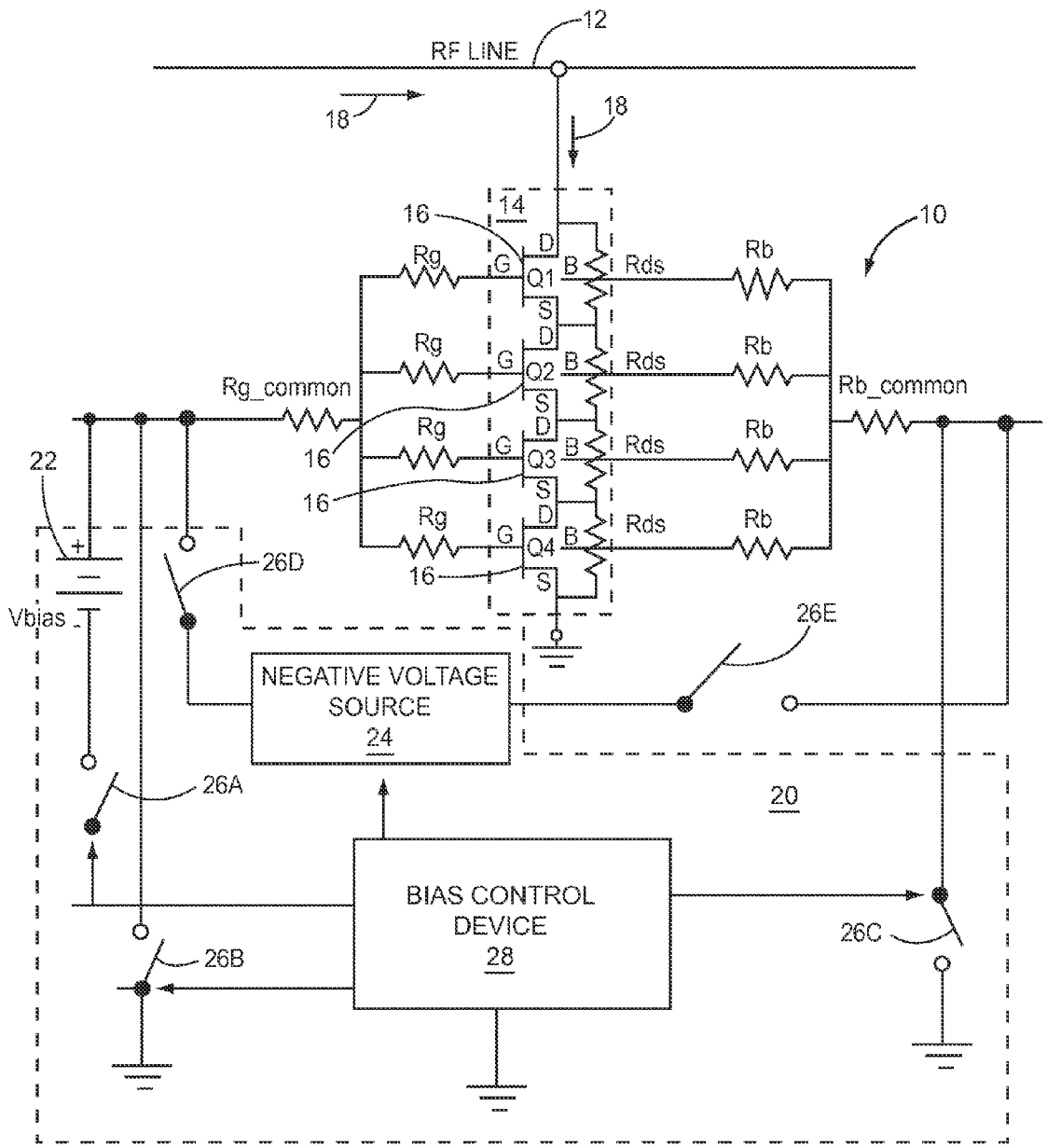
FIG. 1 illustrates a prior art stacked FET switch.
Figure 2:
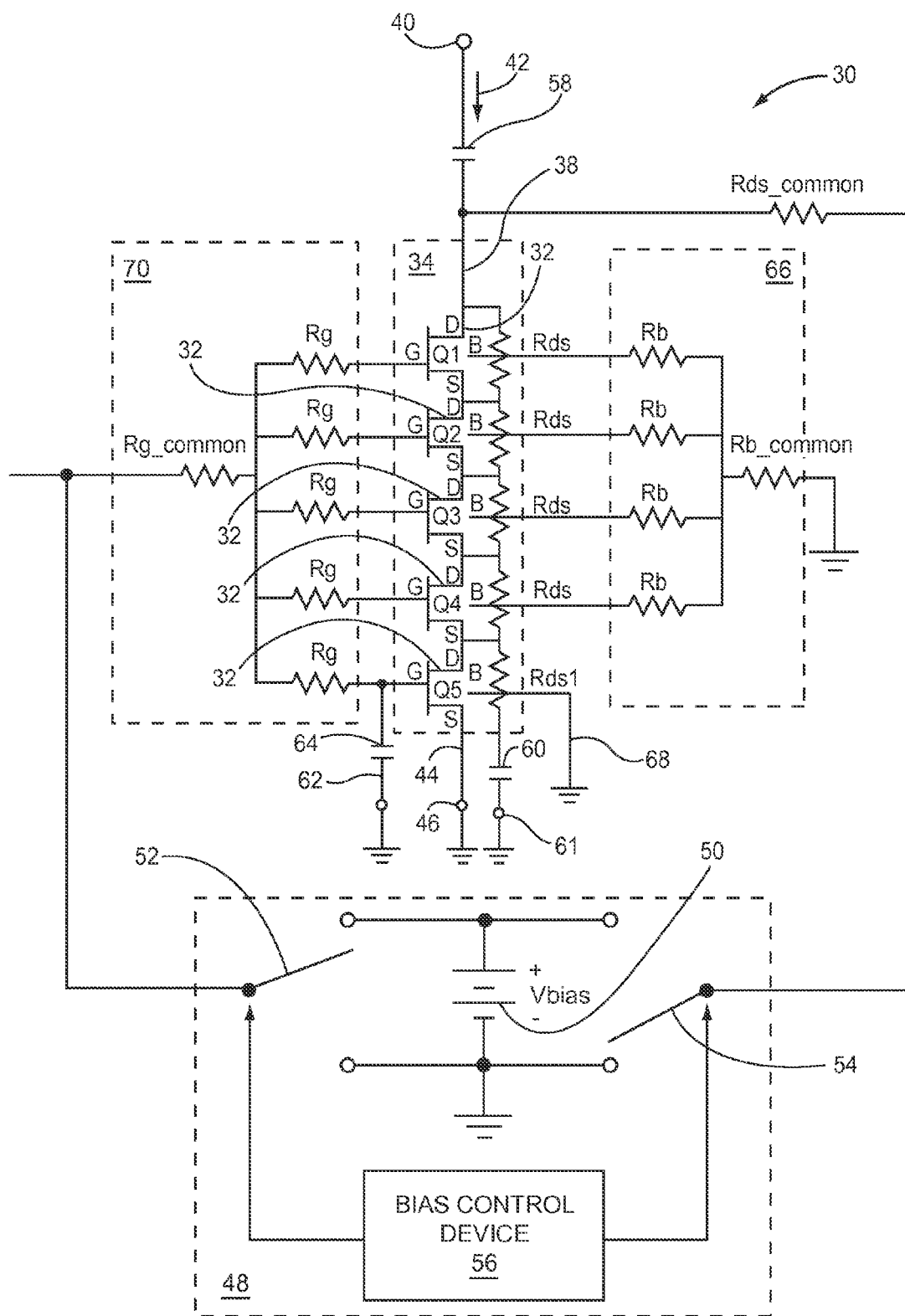
FIG. 2 illustrates one embodiment of a stacked FET switch in accordance with this disclosure.

FIG. 2 illustrates one embodiment of a stacked FET switch 30. The stacked FET switch 30 includes a plurality of FET devices (referred to generically as elements 32 and to a specific FET device as elements $Q_1$-$Q_5$) that are coupled in series to one another to form an FET device stack 34. In this embodiment, the FET device stack 34 has five (5) FET devices 32. However, as explained in further detail below, the FET device stack 34 may have any number of FET devices 32 greater than one (1). Each of the plurality of FET devices 32 has a source, a drain, and a gate. To make electrical connections to the sources, drains, and gates, each of the plurality of FET devices 32 include source contacts, S, drain contacts, D, and gate contacts, G. In this example, each of the FET devices 32 also includes a body contact, B, to connect to a body of the FET device 32. However floating body embodiments that do not include a body contact, B, and have bodies that are self-biased can also be implemented in accordance with this disclosure.

The plurality of FET devices 32 of the stack are coupled in series to form a chain that has a first FET device ($Q_1$), a second FET device ($Q_2$), a third FET device ($Q_3$), a fourth FET device ($Q_4$), and a fifth FET device ($Q_5$). The second FET device, ($Q_2$), the third FET device ($Q_3$), and the fourth FET device ($Q_4$) are middle FET devices ($Q_2$-$Q_4$) which are coupled between the first FET device ($Q_1$) and the fifth FET device ($Q_5$). In the illustrated FET device stack 34, the drain contact, D, of the first FET device ($Q_1$) is positioned at the first end 38 of the FET device stack 34 and is connected to an input terminal 40 for receiving a time-variant input signal 42, such as a radio frequency (RF) signal. At a second end 44 of the FET device stack 34, the fifth FET device ($Q_5$) has a source contact, S, that is directly connected to an output terminal 46 which connects to ground.

The FET device stack 34 may be formed, for example, on a silicon-on-insulator (SOI) type substrate, a silicon-on-sapphire (SOS) type substrate, a Galium Arsenide (GaAs) type substrate, or the like. Each of the plurality of FET devices 32 in the FET device stack may be a complementary metal-oxide-semiconductor (CMOS) type transistor, such as a metal-oxide-semiconductor field effect transistor (MOSFET). The FET devices 32 may also be metal semiconductor field effect transistors (MESFET), a high mobility field effect transistor (HFET), or the like. Utilizing SOI type substrates, SOS type substrates, and GaAs type substrates, may be advantageous in some applications because of the high degree of insulation provided by their internal layers. For example, in an SOI type substrate, the FET devices are formed on a device layer and an insulating layer (also known as a Buried Oxide layer "BOX") may be provided between a handle layer and the device layer. The insulating layer is typically made from an insulating or dielectric type oxide material such as $SiO_2$ while the handle layer is typically made from a semiconductor, such as silicon (Si). The degradation in bandwidth normally associated with the stacking of FET devices 32 and the increased parasitic capacitances of the extra components can be reduced utilizing SOI, SOS, or GaAs type substrates. Other techniques provided in this disclosure may also be utilized to suppress the loading effects of these parasitic capacitances. However, SOI type substrates, silicon-on-sapphire type substrates, and GaAs type substrates are not required and the particular substrate utilized to form the plurality of FET devices 32 should be determined in accordance with factors for associated with a particular desired application, such as, a required bandwidth response, distortion tolerances, cost, and the like. Also, the sources and drains between one of the plurality of FET devices 32 and another one of the plurality of FET devices 32 may be independent of one another or may be merged into a single drain/source having drain and source contacts, D, S for each FET device 32.

During an open state of the FET device stack 34, the plurality of FET devices 32 are off and the FET device stack 34 presents a high impedance between the first end 38 and the second end 44. Consequently, very little current, if any, is transmitted from the FET device stack 34 to the output terminal 46. On the other hand, in the closed state, the plurality of FET devices 32 have a low impedance and thus transmit the time-variant input signal 42 to the output terminal 46.

To switch the FET device stack 34 between the open state and the closed state, the stacked FET switch 30 has a control circuit 48 that is operably associated with the FET device stack 34. In this embodiment, the control circuit 48 has a DC voltage source 50, a first switch 52, a second switch 54, and a bias control device 56. The first switch 52 and the second switch 54 may be any type of suitable switch for providing the desired bias voltages. For example, the first switch 52 and second switch 54 may be transistor switches or inverters. The control circuit 48 is connected to each of the gate contacts, G, and to the first end 38 of the FET device stack 34 through the resistor $R_{ds\_common}$. Since the drain contact, D, is at the first end 38 of the FET device stack 34, one could also state that the control circuit 48 is connected to the drain contact, D, of the first FET device ($Q_1$), through the resistor, $R_{ds\_common}$. The middle FET devices ($Q_2$-$Q_4$) each have a resistor, $R_{ds}$, coupled between the drain contact, D, and the source contact, S. The fifth FET device ($Q_5$) has a resistor $R_{ds1}$ connected to the drain contact, D. The resistors, $R_{ds1}$, $R_{ds\_common}$, may provide power dissipation, and impedance matching for the FET devices 32.

The stacked FET switch 30 may include a DC blocking device, such as a first capacitor 58, coupled in series between the input terminal 40 and the first end 38 of the FET device stack 34. The first capacitor 58 may help distribute the time-variant input signal 42 across the FET device stack 34. A DC blocking device, such as a second capacitor 60, is coupled between the bottom of resistor, $R_{ds1}$, and a grounded terminal 61. The first capacitor 58 and the second capacitor 60 may hold the bias applied by the control circuit 48 so that the source contacts, S, and drain contacts, D, of the first FET device ($Q_1$) and the middle FET devices ($Q_2$-$Q_4$) are biased appropriately. In addition, the second capacitor 60 also operates to block the bias applied by the control circuit 48 and, in this manner, the source contact, S, of the fifth FET device ($Q_5$) experiences no or very little biasing from the control circuit 48. The resistors, $R_{ds1}$, $R_{ds\_common}$, the first capacitor 58, and the second capacitor 60 are connected to each of the plurality of FET devices 32 so that the voltage stress of the time-variant input signal 42 is appropriately distributed across the FET device stack 34 during the open state and so that the appropriate drain and source contacts, D, S, are biased by the control circuit 48. This distribution may be done in conjunction with the parasitic coupling afforded by the parasitic capacitances of the FET devices 32 between the gate to source, gate to drain, body to source, gate to body, and/or body to drain. These parasitic capacitances may occur at high frequencies above the high pass filter poles of the stacked FET switch 30.

By applying the bias to the drain contact, D, of the first FET device ($Q_1$), the control circuit 48 of FIG. 2 is connected to bias the drain contact, D and the source contact, S, of each of the FET devices ($Q_1$-$Q_4$). In this embodiment, the source contact, S, of the fourth FET device ($Q_4$) and the drain contact, D, of the fifth FET device ($Q_5$) are directly connected to one another and thus biasing the drain contact, D and the source contact, S, of each of the FET devices ($Q_1$-$Q_4$) also biases the drain contact, D, of the fifth FET device ($Q_5$). Consequently, all of the drain and source contacts S, D, between the drain contact, D, of the first FET device ($Q_1$) and the drain contact, D, of the fifth FET device ($Q_5$) are biased by the control circuit 48. However, the second capacitor 60 operates as a DC block which prevents the control circuit 48 from biasing the source contact, S, of the fifth FET device ($Q_5$).

While the control circuit 48 is connected to the drain contact, D, of the first FET device ($Q_1$), through a resistor, $R_{ds\_common}$, the control circuit 48 may be connected, either directly or indirectly, to any one, more than one, or all of the to the drain contact, D, of the fifth FET device ($Q_5$), through the drain contact, D, and/or source contacts, S, of the FET devices ($Q_1$) to provide the appropriate bias voltages. In the illustrated embodiment, the control circuit 48 may be connected anywhere to the FET device stack 34 where the bias of the FET device stack 34 is not blocked by the first capacitor 58 and the second capacitor 60. For example, the control circuit 48 may be connected to apply the bias between the bottom of resistor, $R_{ds1}$, and the top of the second capacitor 60. Different connection topologies between the control circuit 48 and FET device stack 34 may be advantageous or disadvantageous for different reasons. Sensitivity to turn-on times may be considered when determining the particular circuit topology for connecting the control circuit 48 with the FET device stack 34. Also, loading effects may be considered for the particular application. For example, the path that connect the control circuit 48 to the drain contact, D of the first FET device ($Q_1$) has resistors, $R_{ds\_common}$, which may present a load at the first end 38 of the FET device stack 34. While this connection topology may be advantageous in reducing distortion, the connection topology may also cause leakage currents. In addition, different types of filtering devices (not shown) and the like may be connected between the control circuit 48 and the FET device stack 34 to prevent the time-variant input signal 42 from leaking into and damaging the control circuit 48. These and other circuit topologies for connecting the control circuit 48 to the FET device stack 34 would be apparent to one of ordinary skill in the art in light of this disclosure.

To place the FET device stack 34 in the closed state, the control circuit 48 biases the gate contacts, G, of each of the plurality of FET devices 32 at a first voltage, $+V_{bias}$, relative to a reference voltage. In this example, the reference voltage is ground. In alternative embodiments, the reference voltage may be at other voltage levels depending on the design requirements of the stacked FET switch 30 or the external nodes that are connected to the stacked FET switch 30. If the plurality of FET devices 32 are depletion mode type FET devices 32, the plurality of FET devices 32 have a reverse biased pinch-off voltage $(-V_p)$. Since the first voltage, $+V_{bias}$, is positive relative to the reference voltage (ground in this case) and has a magnitude greater than a reverse biased pinch-off voltage, $(-V_p)$, the plurality of FET devices 32 are turned on by the first voltage, $+V_{bias}$. For a depletion-mode type FET device 32, the pinch-off voltage $(-V_p)$ is the voltage at the gate contact, G, relative to a voltage of the source contact, S, at which a channel of the FET device 32 is pinched off. In other words, if a reverse bias greater than the pinch-off voltage, $(-V_p)$, is applied between the gate contact, G, and the source contact, S, of the FET device 32, the FET device 32 is turned off and placed in the open state. On the other hand, the plurality of FET devices 32 may also be enhancement mode type FET devices 32. In this case, a forward-biased pinch-off voltage, $(+V_p)$, (also known as a threshold voltage) is required to turn on the channel of the FET device 32. As a result, if a forward bias less than the pinch-off voltage, $(+V_p)$, is applied between the gate contact, G, and the source contact, S, of the enhancement mode type FET device 32, the enhancement mode FET device 32 is turned off and placed in the open state. Accordingly, the FET devices 32 are placed in the closed state by the first voltage, $+V_{bias}$, because the first voltage is greater than the pinch-off voltage, $(+V_p)$ or $(-V_p)$ depending on the type of FET device 32.

In the illustrated embodiment of FIG. 2, the plurality of FET devices 32 are the same type of FET device 32 and have essentially the same characteristics. For example, the FET devices may all be considered to have relatively the same reverse biased pinch-off voltage, $(-V_p)$. It should be noted that this is not required. In other embodiments, each or some of the plurality of FET devices 32 may be of different types and have different characteristics. In these alternative embodiments, the first voltage, $+V_{bias}$, should be selected accordingly to provide the appropriate voltage for the channels of each of the FET devices 32 and place FET device stack 34 in the closed state.

Referring again to FIG. 2, the control circuit 48 applies a second voltage to the drain contact, D of the first FET device ($Q_1$) during the closed state. The second voltage should be less than the first voltage but non-negative relative to the reference voltage. In this embodiment, the second voltage is the same as the reference voltage, which in this case is ground; however, in other embodiments, higher voltages having a voltage level between the reference voltage and the first voltage may be selected. By applying the second voltage at the drain contact, D of the first FET device ($Q_1$), each of drain contacts, D, and source contacts, S, from the drain contact, D, of the first FET device ($Q_1$), through the drain contact, D, of the fifth FET device ($Q_5$) are also biased to ground. The source contact of the fifth FET device ($Q_5$) is coupled to ground through the output terminal 46. Accordingly, the control circuit 48 biases the gate contacts, G, of the plurality of FET devices 32 at the first voltage relative to the source contacts, S, which are at ground. In this manner, each of the gate contacts, G, of the FET device 32 are above the reverse biased pinch-off voltage, $(-V_p)$ relative to their respective source contacts, S, and the FET devices 32 are each turned on. Accordingly, the FET device stack 34 is switched into the closed state and the time-variant input signal 42 is transmitted through the FET device stack 34.

The control circuit 48 is also operable to place the FET device stack 34 in the open state by biasing the gate contacts, G, of the plurality of FET devices 32 at the second voltage (in this case ground) relative to a reference voltage (in this case ground). Also, the control circuit 48 applies a bias to the drain contact, D, of the first FET device ($Q_1$) at the first end 38 at the first voltage, $+V_{bias}$, during the open state. This in turn causes each of drain contacts, D, and source contacts, S, from the first FET device ($Q_1$) through the fourth FET device ($Q_4$), to be positively biased at the first voltage, $+V_{bias}$, relative to the reference voltage. The drain contact, D, of the fifth FET device ($Q_5$) is also biased at $+V_{bias}$ since it is directly connected to the source contact, S, of the fourth FET device ($Q_4$). The second capacitor 60 holds the bias $+V_{bias}$ for each of drain contacts, D, and source contacts, S, from the first FET device ($Q_1$) through the fourth FET device ($Q_4$) and for the drain contact, D, of the fifth FET device ($Q_5$). The second capacitor 60 also blocks the bias so that the source contact, S, of the fifth FET device ($Q_5$) is not biased by the control circuit 48 at $+V_{bias}$. As discussed above, the second voltage of the illustrated embodiment is the same as reference voltage, which is ground, and thus the gate contacts, G, of each of the plurality of FET devices 32 are biased at zero (0) volts relative to ground during the open state. Notice that while each of the gate contacts, G, of the plurality of FET devices 32 are non-negatively biased relative to the reference voltage, the gate contacts, G, are negatively biased at $-V_{bias}$ relative to each of drain contacts, D, and source contacts, S, from the first to the fourth FET device ($Q_1$-$Q_4$) through the fourth FET device ($Q_4$) and the drain contact, D, of the fifth FET device ($Q_5$).

As discussed above, the first capacitor 58 and the second capacitor 60 are configured to block the bias applied by the control circuit 48 and thus, the source contact, S, of the fifth FET device ($Q_5$) is not biased (or at least not significantly biased) at the first voltage, $+V_{bias}$, during the open state by the control circuit 48. To prevent the time-variant input signal 42 from activating the gate to source of the fifth FET device ($Q_5$), a first decoupling path 62 is provided and configured to pass the time-variant input signal 42 during the open state. In this embodiment, the first decoupling path 62 has a first decoupling capacitor 64. The first decoupling capacitor 64 is configured to pass the time-variant input signal 42 by presenting a low impedance to the time-variant input signal 42 relative to the impedance of the fifth FET device ($Q_5$) during the open state. In this manner, the time-variant input signal 42 does not present a (significant) voltage load between the gate contact, G, and the source contact, S, of the fifth FET device ($Q_5$).

In the illustrated embodiment, the drains and sources of the FET devices 32 are congruent and the impedance characteristics between the drain contact, D, and the gate contact, G, and the source contact, S, and the gate contact, G, of each of the FET devices 32 are essentially the same. Thus, the voltage drop of the time-variant input signal 42 from the drain contact, D, to the gate contact, G, and from the gate contact, G, to the source contact, S, for each of the first through fourth FET devices ($Q_1$-$Q_4$) is essentially the same when the FET device stack 34 reaches steady state conditions. Thus half of the voltage drop for the time-variant input signal 42 across each of the first through fourth FET devices ($Q_1$-$Q_4$) occurs from the drain contact, D, to the gate contact, G, and the other half occurs from the gate contact, G, to the source contact, S during the open state. As explained in further detail below, the voltage drop of the time-variant input signal 42 from the drain contact, D, to the gate contact, G, of the fifth FET device ($Q_5$) is the same as the voltage drop from one of the gate contact, G, to drain contact, D, or gate contact, G, to source contact, S, of voltage drops of the first through fourth FET devices ($Q_1$-$Q_4$) during the open state. In other words, the voltage drop of the time-variant input signal 42 across the fifth FET device ($Q_5$) is half of the voltage drop across one of the middle FET devices ($Q_2$-$Q_4$) during the open state.

To prevent the gate to source of the fifth FET device ($Q_5$) from being activated during the open state, the first decoupling path 62 is connected to the FET device stack 34 such that the time-variant input signal 42 bypasses the FET device stack 34 from the gate contact, G, to the source contact, S, of the fifth FET device ($Q_5$). In the illustrated embodiment, the first decoupling path 62 is connected directly to the gate contact, G, and the source contact, S. In this manner, the time-variant input signal 42 does not present a (significant) voltage load from the gate contact, G, to the source contact, S, of the fifth FET device ($Q_5$).

By selecting the magnitude of, the first voltage, $+V_{bias}$, with respect to the pinch-off voltage, in this case, $(-V_p)$, prevents the time-variant input signal 42 from forcing the FET device stack 34 out of the open state. This is because the first voltage $+V_{bias}$ creates a buffer that prevents the activation of FET device stack 34 from the source contact, S, of the first FET device ($Q_1$), through the drain contact, D, of the fifth FET device ($Q_5$). This buffer can be expressed as the bias voltage $+V_{bias}$ plus the pinch-off voltage, $(-V_p)$, as shown below:

$$V_{buffer} = +V_{bias+}(-V_p)$$

Since the time-variant input signal 42 must cause a voltage greater than $+V_{bias+}(-V_p)$, at the gate contacts, G, to turn on the FET devices ($Q_1$-$Q_4$) during the open state, the buffer of $V_{buffer}=+V_{bias+}(-V_p)$ prevents the FET device stack 34 from being forced out of the open state. The FET devices 32 may have congruent drains and sources that have similar activation and deactivation characteristics between the gate contact, G and the drain contact, D, and the gate contact, G, and the source contact, S. In this case, biasing the drain contact, D, of the FET devices 32 also provides a buffer of $+V_{bias+}(-V_p)$ that prevents the drain to gate of the FET devices 32 from being activated in the open state of the FET device stack 34. Accordingly, biasing the drain contact, D, of the fifth FET device ($Q_5$) also provides the same buffer of $+V_{bias+}(-V_p)$ that prevents the drain to gate of the fifth FET device ($Q_5$) from being activated in the open state of the FET device stack 34.

For depletion mode type FET devices 32, the buffer is less than the magnitude of the bias voltage $+V_{bias}$. However, for enhancement mode type FET devices 32, the buffer is greater than the magnitude of $+V_{bias}$, i.e. $V_{buffer}=+V_{bias+}(+V_p)$. Also note that, if in the alternative, the drains and sources of one or more of the FET devices 32 is not congruent then the buffer may be different between the gate contact, G, and the drain contact, D, and the source contact, S, and the gate contact, G, of the FET device 32.

The buffer, $V_{buffer}$, is provided by the control circuit 48 without requiring the use of a negative voltage source, such as a negative-charge pump. In addition, the bias swing from the open state to the closed state and vice versa at the gate contacts, G, of each of the plurality of FET devices is only the first voltage minus the second voltage. In this case, the first voltage is at $+V_{bias}$ and the second voltage is at ground and thus the bias swing created by the control circuit is only $|V_{bias}|$. Since the voltage swing is not greater than $|V_{bias}|$, transition states are not needed to prevent the voltage between the drain and gate contacts, D, G, of the FET devices 32 from exceeding the voltage handling capabilities of the FET devices 32 when transitioning to and from the open and closed states.

The FET device stack 34 is also prevented from being forced out of the open state by the first decoupling path 62. The first decoupling path 62 is configured to pass the time-variant input signal 42 during the open state so that the time-variant input signal 42 causes no or a small voltage drop from the gate contact, G, to the source contact, S of fifth FET device ($Q_5$) during the open state. Utilizing the first decoupling path 62 instead of simply biasing the source contact, S, of the fifth FET device ($Q_5$) may have certain advantages during large signal conditions when the time-variant input signal 42 can create very high voltages where the buffer, $V_{buffer}$, may be insufficient to prevent the activation of the FET device ($Q_1$-$Q_4$) and the fifth FET device ($Q_5$) from the drain contact, D, to the source contact, S. Since the first decoupling path 62 bypasses the time-variant input signal 42, no or a small voltage load is presented by the time-variant input signal 42 from the gate contact, G, to the source contact, S, of the fifth FET device ($Q_5$). Thus, the gate to source of the fifth FET device ($Q_5$) remains off and any chain reaction caused by the activation of any of the other the drain to gate contacts, D, S, or gate to source contacts, G, S, of the FET devices 32 may be stopped to maintain the FET device stack 34 in the open state. While the FET device stack 34 may lose half of the load handling capabilities of the fifth FET device ($Q_5$) due to the first decoupling path 62, the first decoupling path 62 prevents the FET device stack 34 from being forced out of the open state during large signal conditions.

Note that in the illustrated embodiment, the plurality of FET devices 32 have essentially the same characteristics and it was also assumed that the impedance characteristics between both the gate contacts, G, and the drain contact, D, and the gate contact, G and the source contacts, S, of each of the FET devices 32 are substantially congruent at the frequencies of interest. However, this is not necessarily the case, and in other embodiments, each or some of the plurality of FET devices 32 may be of different types having different characteristics. In these alternative embodiments, the first voltage, $+V_{bias}$, should be selected accordingly to place FET device stack 34 in the open state and provide the appropriate buffer without causing excessive bias swings. Also, the FET device stack 34 should distribute the voltage of the time-variant input signal 42 across the FET device stack 34 in accordance with the impedance characteristics of the FET devices 32 to reduce the probability of damaging the FET devices 32 or creating excessive leakage currents. For example, in certain applications, the fifth FET device ($Q_5$) may be formed to be wider than the middle FET devices ($Q_2$-$Q_4$) to help reduce leakage currents.

To help ensure that the voltage drop of the time-variant input signal 42 is appropriately distributed across the FET device stack 34, a distribution network may be provided on the FET device stack 34. One example of such a distribution network is shown in FIG. 2, as the first capacitor 58, the second capacitor 60, and resistors, $R_{ds}$, $R_{ds1}$, and $R_{ds\_common}$. The first capacitors 58 and second capacitor 60 operate as DC blocks and may help evenly distribute the time-variant input signal 42. Also, the first capacitor 58 and second capacitor 60 behave as high-pass filters by blocking the bias voltages from the control circuit 48 but presenting a low impedance to the time-variant input signal 42 in the open state. Note that the bottom of the resistor $R_{ds1}$ is connected to the top of the second capacitor 60. As a result, the voltage drop of the time-variant input signal 42 across the resistor $R_{ds1}$, is the same as the voltage drop from the drain contact, D, to the gate contact, G. In essence, the resistor $R_{ds1}$ and the drain to gate of the fifth FET device ($Q_5$) appear essentially in parallel to the time-variant input signal 42 during the open state and thus experience the same voltage drop with respect to the time-variant input signal 42. The voltage drop from the drain contact, D, to the source contact, S, of each of the FET devices ($Q_1$-$Q_4$) is about the same as the voltage drop across the resistors, $R_{ds}$.

As discussed above, each of the FET devices 32 of FIG. 2 may have congruent drains and sources and thus have the same impedance characteristics from the gate contact, G, to the drain contact, D, and from the gate contact, G, to the source contact, S. Since the time-variant input signal 42 bypasses the FET device stack 34 from the gate contact, G, to the source contact, S, of the fifth FET device ($Q_5$), the distribution network may be configured to evenly distribute the time-variant input signal 42 across the remaining gate to source contacts, G to S, and gate to drain contacts, G to D of the FET device stack 34 during the open state. Accordingly, the resistive value of $R_{ds1}$ may be about half of the resistive value of the resistors, $R_{ds}$, since as explained above, the first decoupling path 62 prevents a significant voltage drop of the time-variant input signal 42 from the gate contact, G, to the source contact, S, of the fifth FET device ($Q_5$). The resistor, $R_{ds\_common}$, may also be utilized to prevent currents from leaking into the control circuit 48 for the FET device stack 34.

It should be noted however that this is simply one example of a distribution network for distributing the time-variant input signal 42 across the FET device stack 34 and the distribution network may have any other suitable circuit topology. For instance, active components, such as transistors, may be utilized to replace one or more of the passive resistors, $R_{ds\_common}$, $R_{ds1}$, and $R_{ds}$, and/or the first and second capacitors 58, 60. In addition, if the FET devices 32 are different types of devices and are not substantially similar to one another, the relationship between the resistance values of the resistors $R_{ds\_common}$, $R_{ds1}$, and $R_{ds}$, may vary in accordance to the impedance characteristics of each of the FET devices 32 or the voltage loading desired across any one of the FET devices 32. For example the resistance of resistors $R_{ds\_common}$, $R_{ds1}$, and $R_{ds}$ may vary if one or more of FET devices 32 have dissimilar impedance characteristics to the other FET devices 32 or if one or more of the FET devices 32 do not have congruent drains and sources. Other circuit components in addition to resistors, $R_{ds}$, such as capacitors, may also couple across the drain contacts, D, and source contacts, S, to help ensure a more even distribution of the time-variant input signal 42 across the FET device stack 34. The capacitors may be implemented utilizing metal-insulator-metal (MIM) capacitors or parasitic capacitors if desired. In addition, variations in the voltage loading across the FET device stack 34 caused by practical considerations, such as leakage currents, may require circuit topologies for the distribution network to correct for non-ideal behavior.

Next, the plurality of FET devices 32 in the stacked FET switch 30 of FIG. 2 each have a body and a body contact, B, to bias the body of the FET device 32. The body contacts, B, of the plurality of FET devices 32 are biased to a bias voltage, in this case ground, whether the FET device stack 34 is in the open state or in the closed state. Biasing the body contact, B, of the plurality of FET devices 32 may be utilized to help define the voltages in the bodies of the plurality of FET devices 32 and reduce distortion. However, in the alternative, the plurality of FET devices 32 may not have body biasing. For example, alternative embodiments may have floating body designs even if the FET devices 32 are the type of FET devices 32 that require a negative bias between the transistor bodies and the drain and source contacts, D, S, to prevent the activation of reverse-body diodes when the FET device stack 34 is operating in the open state. While the body contacts, B, of the plurality of FET devices 32 in FIG. 2 may be biased to ground, the drain contacts, D, and source contacts, S, of the first through fourth FET devices ($Q_1$-$Q_4$) and the drain contact of the fifth FET device ($Q_5$) are biased to the first voltage, $+V_{bias}$, during the open state. Thus, the voltage bias seen between the body contacts, B, and the drain and source contacts, D, S, is a negative voltage, in this case $-V_{bias}$. Accordingly, a negative voltage is presented at the body contacts, B, relative to the drain and source contacts, D, S, without requiring a negative voltage source, such as a negative-charge pump. As a result, floating body topologies may be utilized even if the FET devices 32 are the type of FET devices 32 that require a negative bias to prevent the activation of reverse-body diodes.

The stacked FET switch 30 may also include a resistive circuit 66 coupled to body contacts, B, of the FET devices ($Q_1$-$Q_4$). The resistive circuit 66 includes a resistor, $R_{b\_common}$, and a resistor, $R_b$, coupled in series with each of the plurality of body contacts, B. The resistance presented by the resistive circuit 66 at the body contacts, B, may be high relative to the parasitic capacitances between the bodies the FET devices ($Q_1$-$Q_4$) and the source and drain contacts, S, D at the frequency of interest. Other alternative circuit topologies provide the high resistance at the body terminals, B. For example and without limitation, all of the high resistance may be provided by a single resistor, such as, $R_{b\_common}$, or alternatively, $R_{b\_common}$, may not be provided at all. Active devices, such as transistors, may also be utilized. These and other circuit topologies for the resistive circuit would be apparent to one of ordinary skill in the art in light of this disclosure.

The stacked FET switch 30 in FIG. 2 also includes a second decoupling path 68 coupled directly to the body contact, B, of the fifth FET device ($Q_5$) and to ground. Thus, the time-variant input signal 42 does not present a voltage load at the body contact, B, of the fifth FET device ($Q_5$) and the voltage at the body contact, B, of the fifth FET device ($Q_5$) is well defined at ground which may help prevent the reverse-body diodes in the body of the fifth FET device ($Q_5$) from being turned on by the time-variant input signal 42.

It should be noted that, if the FET devices 32 are CMOS type transistors built having a deep nwell, it may be desirable for the bias voltage at the body contacts, B, to be greater than the reference voltage to help avoid the activation of the reverse-body under large signal conditions. To do this, the body contacts, B, may be coupled to the positive terminal of the DC voltage source, 50, or to another internal or external voltage source, instead of ground. In other embodiments, the bodies of the FET devices 32 may be left floating and the deep nwell may be biased through a high value resistor to allow the deep nwell to self-bias under large signal conditions.

The stacked FET switch 30 shown by FIG. 2 includes a resistive circuit 70 that is coupled to the gate contacts, G, of the plurality of FET devices 32. In this embodiment, the resistive circuit 66 includes a common resistor, $R_{g\_common}$, and resistors, $R_g$, coupled in series to each one of the gate contacts, G. The resistive circuit 70 should present a high resistance at each of the gate contacts, G, relative to an impedance of the parasitic capacitances between the gates of the plurality of FET devices 32 and the drains and sources, such that the parasitic capacitances are rendered negligible at the frequency of interest. In this manner, the resistive circuit 70 does not load the FET device stack 34 and the FET device stack 34 has less distortion while preserving bandwidth. Other alternative circuit topologies may be utilized to provide the high resistance. For example and without limitation, all of the high resistance may be provided by a single resistor, such as, $R_{g\_common}$, or alternatively, $R_{g\_common}$, may not be provided at all. Active devices, such as transistors, may also be utilized. These and other circuit topologies for the resistive circuit 66 would be apparent to one of ordinary skill in the art, in light of this disclosure.

As mentioned above, the control circuit 48 of FIG. 2 is operably associated with the gate contacts, G of each of the FET devices 32, the drain contacts, D, and source contacts, S, of the first through fourth FET devices ($Q_1$-$Q_4$), and the drain contact, D, of the fifth FET device ($Q_5$) to provide the appropriate bias voltages relative to the reference voltage. The bias voltage at the gate contacts, G, may be referred to as $V_G$ while the bias voltage provided to the drain contacts, D, and source contacts, S, of the first through fourth FET devices ($Q_1$-$Q_4$), and the drain contact, D, of the fifth FET device ($Q_5$) is referred to as $V_{stack}$. The bias voltages, $V_G$, and $V_{stack}$ are presented in the Table II below.

| Switch State | $V_G$ | $V_{stack}$ |
|---|---|---|
| Open State | Second Voltage | First Voltage |
| Closed State | First Voltage | Second Voltage |

As mentioned above, the first voltage is positive relative to the reference voltage and the second voltage is non-negative relative to the reference voltage but lower than the first voltage. For the illustrated embodiment discussed above for FIG. 2, the specific bias voltages $V_G$, $V_{stack}$ are shown in the Table III below.

| Switch State | $V_G$ | $V_{stack}$ |
|---|---|---|
| Open State | Ground | +$V_{bias}$ |
| Closed State | +$V_{bias}$ | Ground |

The control circuit 48 of the stacked FET switch 30 may be configured in any manner to provide the above mentioned bias voltages, $V_G$, and $V_{stack}$ in Tables II, III. The control circuit 48 may include, for example, logic controllers, sequential controllers, feedback controllers, and/or linear controllers. The control circuit 48 may also receive and transmit control signals and/or have internal programming and memory to determine when to switch the FET device stack 34 to and from the open and the closed states. In addition, while the DC voltage source 50 is included within the illustrated embodiment of the control circuit 48, but in alternative embodiments, the control circuit 48 may simply connect to an external voltage source(s) to provide the appropriate bias voltage.

The stacked FET switch 30 described above for FIG. 2 does not require transition states when switching to and from the open state and the closed state, as shown by Tables II and III. Note, however, that this may not always be the case and alternative embodiments, fast-switch, high stress, or high voltage applications for the FET device stack 34 may require transition states to prevent excessive loading of the FET devices 32 or to ensure that the stacked FET switch 30 functions appropriately with external devices. Thus, the topology and control functions of the control circuit 48 may vary in accordance with the particular application for the stacked FET switch 30. Also, while the second voltage should be non-negative relative to the reference voltage, practical considerations and non-ideal circuit behavior may cause the second voltage to be slightly negative with respect to the reference voltage. Although the second voltage would still remain substantially non-negative relative to reference voltage (in this case ground), the second voltage may have a small negative difference between around (−0.1 V to −0.2V) relative to the reference voltage. In any case, the small negative difference needs to have a magnitude less than 10% of the magnitude of the first voltage relative to the reference voltage.

Next, the control circuit 48 illustrated in FIG. 2 is configured to provide the bias voltages utilizing the DC voltage source 50, the first switch 52, the second switch 54, and the bias control device 56. The positive terminal of the DC voltage source 50 provides the first voltage, +$V_{bias}$, and the grounded terminal provides the second voltage at ground. Connected to the positive terminal and the negative terminal of the DC voltage source 50 are the first and second switches 52, 54, which are operated by the bias control device 56. The first switch 52 connects to the gate contacts, G, of the plurality of FET devices 32 to provide the bias voltage, $V_G$ at the gate contacts, G. The second switch 54 is connected to the drain contact, D, of the first FET device ($Q_1$) apply the bias voltage, $V_{stack}$. The bias control device 56 controls the first and second switches 52, 54, in accordance with Table III above and switch the FET device stack 34 to and from the open and closed states.

The first and second capacitors 58, 60 may be utilized to appropriately biased the FET device stack 34 such that the drain contacts, D, and source contacts, S, of the first through fourth FET devices ($Q_1$-$Q_4$), and the drain contact, D, of the fifth FET device ($Q_5$) are biased by $V_{stack}$ in accordance with Table III, while the second end 44 and thus the source contact, S, of the fifth FET device ($Q_5$) are not biased by the control circuit 48 during the open and closed states.

The stacked FET switch 30 may be useful in building shunt and series coupled RF switches where the input terminal 40 is connected to an RF line. Additionally, the stacked FET switch 30 may be useful in building programmable capacitor arrays (not shown). As is known in the art, programmable capacitor arrays, also known as digitally tunable capacitors, contain switches that open and close paths to different capacitors and thereby vary the capacitance of the programmable capacitor array. These programmable capacitor arrays are often utilized in RF circuits, such as antenna tuners. The stacked FET switch 30 in FIG. 2 already has the first capacitor 58 coupled in series between the input terminal 40 and the first end 38 to help distribute the time-variant input signal 42 more evenly across the FET device stack 34. If a plurality of stacked FET switches, each like the stacked FET switch 30 in FIG. 2, were utilized and coupled accordingly, then the first capacitor 58 in each of the plurality of stacked FET switches could also provide the capacitance for the programmable capacitor array without any additional overhead or loss. Thus, proper calibration of the first capacitor 58 in an array of stacked FET switches, each like the stacked FET switch 30 in FIG. 2, may allow one or more control circuits 48 to vary the capacitance of the programmable capacitor array by selecting which of the stacked FET switches to open and close. Note that while the embodiment in FIG. 2 has the output terminal 46 coupled to ground. Consequently, the stacked FET switch 30 may be utilized as a shunt switch for an RF line. However, in the alternative, the FET device stack 34 may be coupled in series in an RF line so that the output terminal 46 is an RF port.

Figure 3:
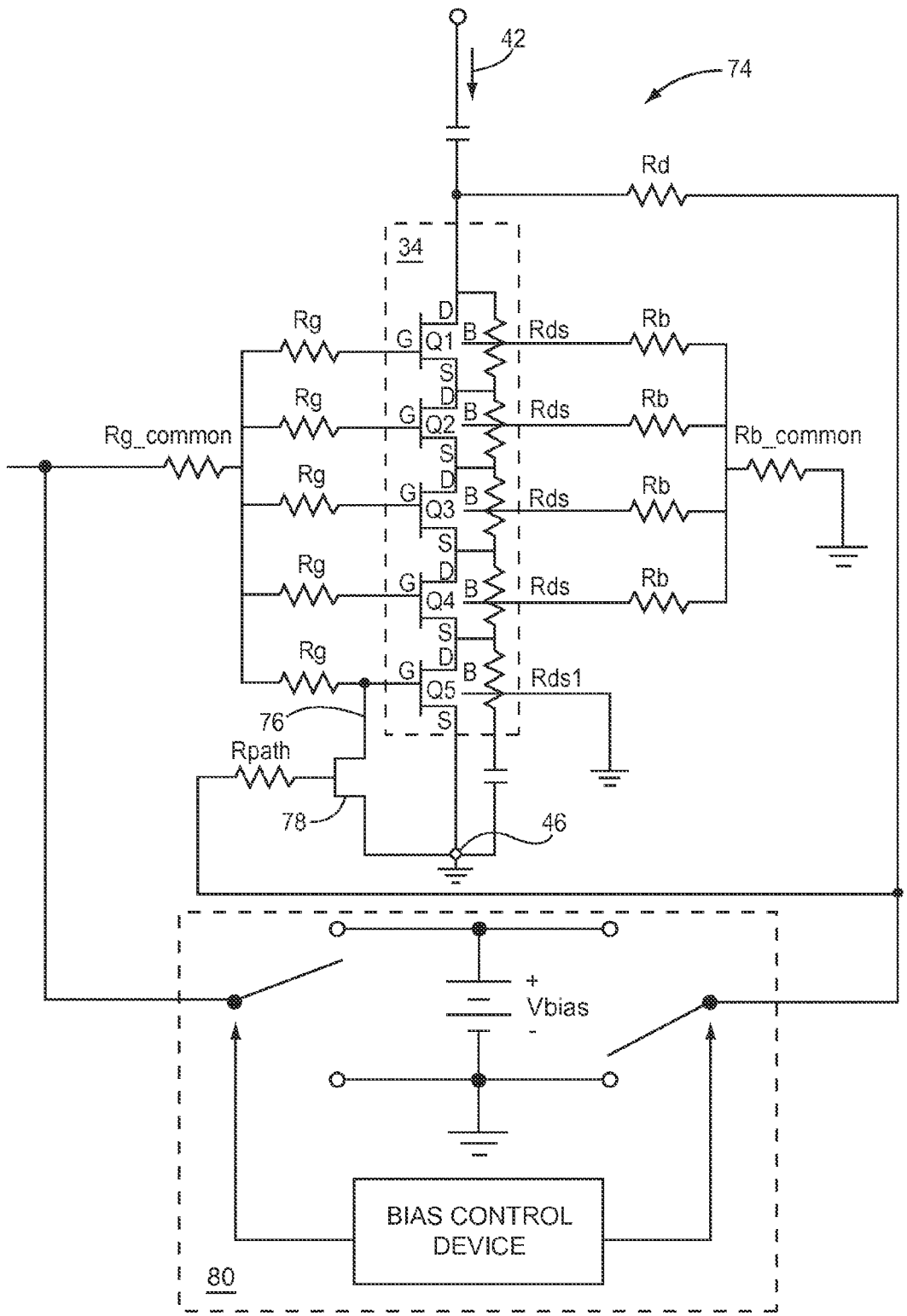
FIG. 3 illustrates another embodiment of a stacked FET switch in accordance with this disclosure.

FIG. 3 illustrates another embodiment of a stacked FET switch 74. The stacked FET switch 74 is similar to the stacked FET switch 30 described above, in FIG. 2. However, in FIG. 3, a first decoupling path 76 is configured to pass the time-variant input signal 42 during the open state through a first decoupling transistor 78 which is operably associated and controlled by a control circuit 80. The first decoupling transistor 78 is a FET device, as illustrated in FIG. 3, or, in the alternative, any other suitable type of transistor. Resistors, $R_{path}$, may be provided to provide a high resistance so that the first decoupling transistor 78 does not load the FET device stack 34.

In the stacked FET switch 74 of FIG. 3, the control circuit 80 is connected to the gate contact, G, of the first decoupling transistor 78 so that it is biased in accordance with $V_{stack}$ from Table II and Table III above. Thus, the first decoupling path 76 is configured to pass the time-variant input signal 42 by having the first decoupling transistor 78 being turned on during the open state of the FET device stack 34. In this manner, a low impedance relative to the impedance of the fifth FET device ($Q_5$) is presented to the time-variant input signal 42 and the time-variant input signal 42 bypasses the FET device stack 34 from the gate contact, G, of the fifth FET device ($Q_5$) to the source contact, S, of the fifth FET device ($Q_5$) during the open state. Consequently, the time-variant input signal 42 drop no or a small voltage from the gate contact, G, of the fifth FET device ($Q_5$) to the source contact, S, of the fifth FET device ($Q_5$) when the FET device stack 34 is in the open state. On the other hand, the first decoupling transistor 78 is turned off during the closed state of the FET device stack 34 so that the time-variant input signal 42 is transmitted through and does not bypass the FET device stack 34 from the gate contact, G, of the fifth FET device ($Q_5$) to the source contact, S, of the fifth FET device ($Q_5$). In this case, the first decoupling transistor 78 is coupled directly from the gate contact, G, of the fifth FET device ($Q_5$) to the output terminal 46 so that when the first decoupling transistor 78 is on the FET device stack 34 is bypassed from gate contact, G, to the source contact, S, of the fifth FET device ($Q_5$). Note that the output terminal 46 in the stacked FET switch 74 is coupled to ground. In this embodiment, the reference voltage for measuring the first and second voltage of Table II above is ground and the second voltage is +0V with relative to ground.

Figure 4:
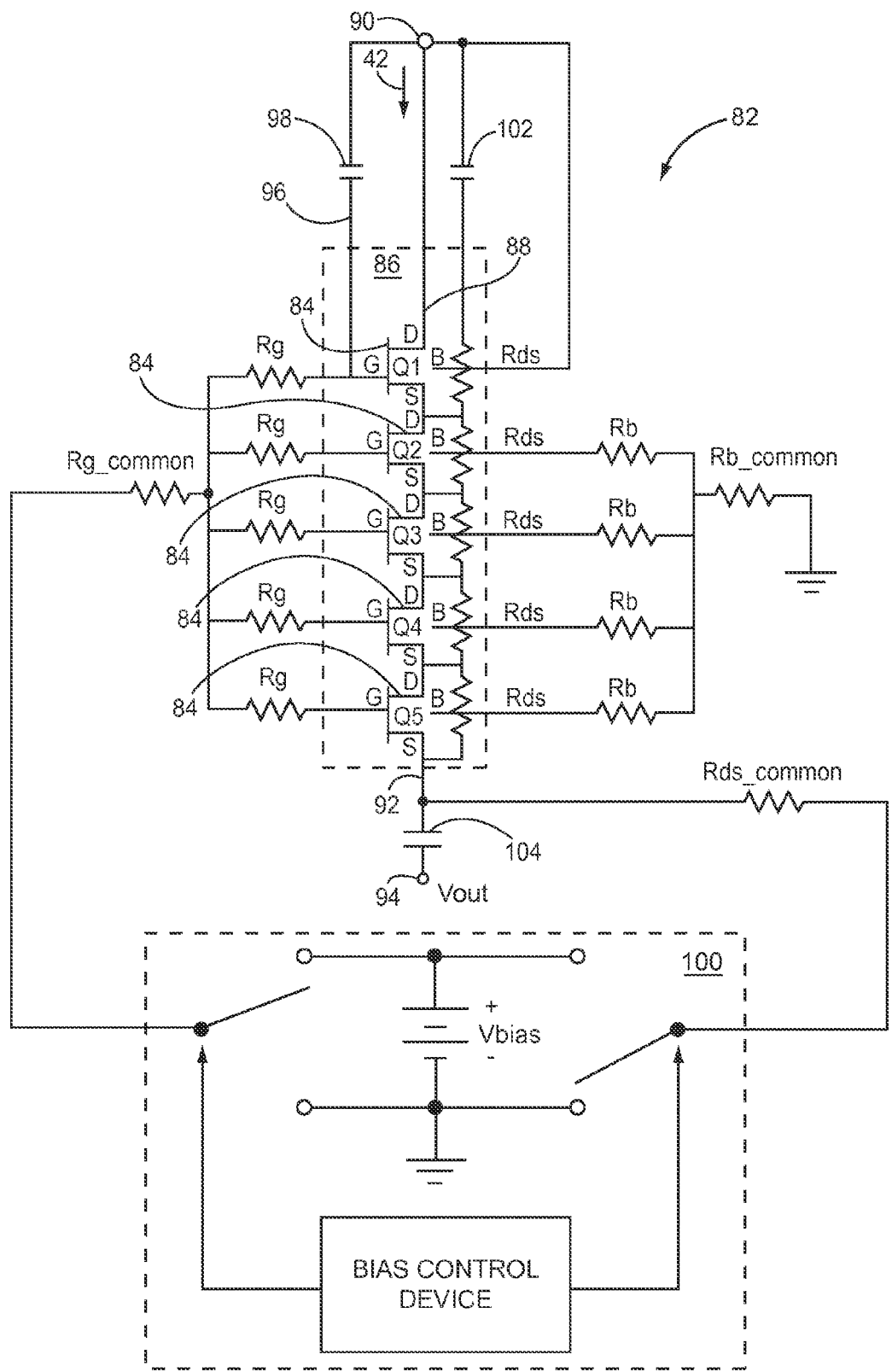
FIG. 4 illustrates yet another embodiment of a stacked FET switch in accordance with this disclosure.

FIG. 4 illustrates another embodiment of a stacked FET switch 82 in which decoupling is provided at the first FET device ($Q_1$) rather than the fifth FET device ($Q_5$). As in the previous embodiments, the stacked FET switch 82 includes a plurality of FET devices (referred to generically as elements 84 and to a specific FET device as elements $Q_1$-$Q_5$) that are coupled in series to one another to form an FET device stack 86. Also, as in the previous embodiments, the FET device stack 86 has five (5) FET devices 84. Each of the plurality of FET devices 84 has a source, a drain, a gate, and a body. To electrically connect to the sources, drains, gates, and bodies, each of the plurality of FET devices 84 include source contacts, S, drain contacts, D, gate contacts, G, and body contacts, B. The plurality of FET devices 84 are coupled in series to form a chain that has a first FET device ($Q_1$), a second FET device ($Q_2$), a third FET device ($Q_3$), a fourth FET device ($Q_4$), and a fifth FET device ($Q_5$). The second FET device, ($Q_2$), the third FET device ($Q_3$), and the fourth FET device ($Q_4$) are middle FET devices ($Q_2$-$Q_4$) which are coupled between the first FET device ($Q_1$) and the fifth FET device ($Q_5$). In the illustrated FET device stack 86, the drain contact, D, of the first FET device ($Q_1$) is positioned at the first end 88 of the FET device stack 86 and is directly connected to an input terminal 90 for receiving the time-variant input signal 42. At a second end 92 of the FET device stack 86, the fifth FET device ($Q_5$) has a source contact, S.

In this embodiment, a first decoupling path 96 is connected directly from the gate contact, G, of the first FET device ($Q_1$) to the input terminal 90. The first decoupling path 96 has a first decoupling capacitor 98 that is configured to pass the time-variant input signal 42 during the open state. The first decoupling path 96 is connected to the FET device stack 86 so that the time-variant input signal 42 bypasses the FET device stack 86 from the drain contact, D, of the first FET device ($Q_1$) to the gate contact, G, of the first FET device ($Q_1$) during the open state. Thus, when the FET device stack 86 is in the open state, no or a small voltage drop is experienced by the time-variant input signal 42 from the drain contact, D, of the first FET device ($Q_1$) to the gate contact, G, of the first FET device ($Q_1$).

In this embodiment, a control circuit 100 is operably associated with the FET device stack 86 to provide the bias voltages, $V_G$, and $V_{stack}$, in accordance with Table II above. A distribution network is provided having resistors, $R_{ds\_common}$, $R_{ds}$, $R_{ds1}$, a first capacitor 102, and a second capacitor 104. The first capacitor 102 is connected from the input terminal 90 to the top of the resistor, $R_{ds1}$. Accordingly, the voltage drop from the drain contact, D, to the source contact, S, of the first FET device ($Q_1$) is the same as the voltage drop across resistor, $R_{ds1}$ with respect to the time-variant input signal 42. However, the first decoupling path 96 decouples the first FET device ($Q_1$) from the drain contact, D, to the gate contact, G with respect to the time-variant input signal 42. Thus, the voltage dropped by the time-variant input signal 42 in the first FET device ($Q_1$) is from the gate contact, G, to the source contact, S. Assuming that the FET devices 84 all have similar characteristics and are substantially symmetrical, the first FET device ($Q_1$) provides about half of the voltage drop as across the other FET devices ($Q_2$-$Q_5$) in the FET device stack 86. Accordingly, $R_{ds1}$ is provided to have about half of the resistance value as the other resistors, $R_{ds}$.

In this arrangement of the distribution network, the connection of first capacitor 102 allows for the drain contact, D, of the first FET device ($Q_1$) to be directly connected to the input terminal 90. The second capacitor 104 is coupled in series between the source contact, S, of the fifth FET device ($Q_5$) at the second end 92 and the output terminal 94. The first capacitor 102 and second capacitor 104 help hold the bias applied by the control circuit 100 while blocking the DC bias from the control circuit 100.

Note that in this embodiment, the input terminal 90 and the output terminal 94 are RF ports and may be coupled in series within an RF line. The voltages at the input terminal 90 and the output terminal 94 are the RF voltages $V_{in}$ and $V_{out}$. Thus, in this embodiment, the reference voltage is $V_{out}$ rather than ground. The first voltage and the second voltage are thus measured with respect to $V_{out}$ instead of ground but have the same relationships discussed above in Table II.

Figure 5:
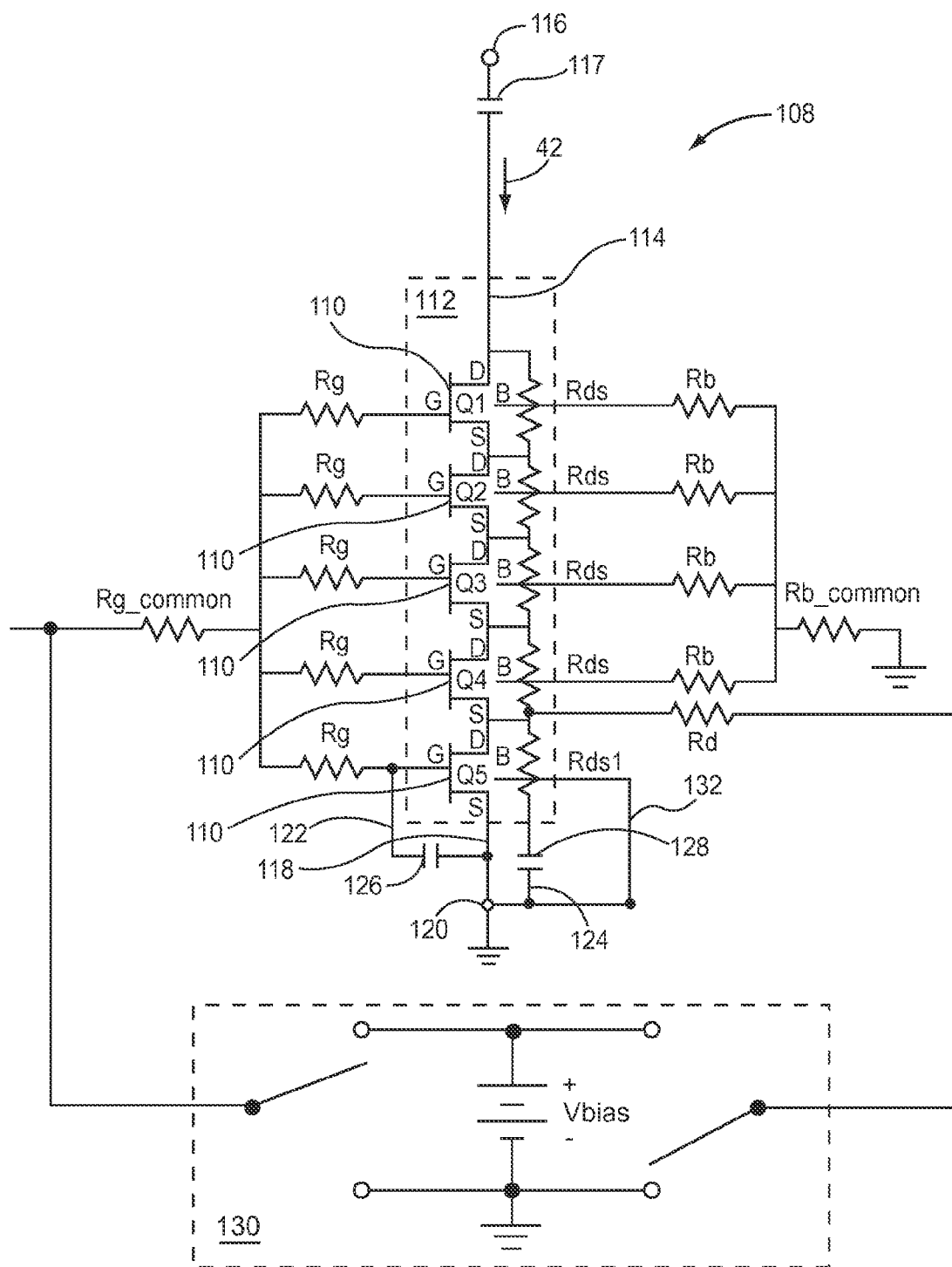
FIG. 5 illustrates still another embodiment of a stacked FET switch in accordance with this disclosure.

FIG. 5 illustrates yet another embodiment of a stacked FET switch 108. As in the previous embodiments, the stacked FET switch 108 includes a plurality of FET devices (referred to generically as elements 110 and to a specific FET device as elements $Q_1$-$Q_5$) that are coupled in series to one another to form an FET device stack 112. Also, as in the previous embodiments, the FET device stack 112 has five (5) FET devices 110. Each of the plurality of FET devices 110 has a source, a drain, a gate, and a body. To electrically connect to the sources, drains, gates, and bodies, each of the plurality of FET devices 110 include source contacts, S, drain contacts, D, gate contacts, G, and body contacts, B. The plurality of FET devices 110 are coupled in series to form a chain that has a first FET device ($Q_1$), a second FET device ($Q_2$), a third FET device ($Q_3$), a fourth FET device ($Q_4$), and a fifth FET device ($Q_5$). The second FET device, ($Q_2$), the third FET device ($Q_3$), and the fourth FET device ($Q_4$) are middle FET devices ($Q_2$-$Q_4$) which are coupled between the first FET device ($Q_1$) and the fifth FET device ($Q_5$). In the illustrated FET device stack 112, the drain contact, D, of the first FET device ($Q_1$) is positioned at the first end 114 of the FET device stack 112 and is connected to an input terminal 116 for receiving the time-variant input signal 42 through a first capacitor 117. At a second end 118 of the FET device stack 112, the fifth FET device ($Q_5$) has a source contact, S, that is directly connected to an output terminal 120 which connects to ground.

The stacked FET switch 108 has a first decoupling path 122 and a second decoupling path 124 connected to the FET device stack 112 at the first FET device ($Q_1$). The first decoupling path 122 and the second decoupling path 124, each have a first decoupling capacitor, 126, and a second decoupling capacitor, 128, respectively. A distribution network is provided that includes resistors, $R_{ds}$, the first capacitor 117, and the second decoupling capacitor 128. The first decoupling capacitor 126 and the second decoupling capacitor 128 are configured to pass the time-variant input signal 42 when the FET device stack 112 is in the open state. The first decoupling path 122 is connected between the gate contact, G, and the source contact, S, of the fifth FET device ($Q_5$) which configures the FET device stack 112 so that the time-variant input signal 42 bypasses the FET device stack 112 from the gate contact, G, to the source contact, S, of the fifth FET device ($Q_5$) during the open state. The second decoupling path 124 is connected directly to the drain contact, D, of the fifth FET device ($Q_5$) and to the output terminal 120. In this manner, the FET device stack 112 is configured so that the time-variant input signal 42 bypasses the FET device stack 112 from the drain contact, D, to the source contact, S, of the fifth FET device ($Q_5$) during the open state. Thus, the fifth FET device ($Q_5$) does not handle or handles only a small amount of the voltage load caused by the time-variant input signal 42 during the open state.

Note that while the second decoupling path 124 alone causes the time-variant input signal 42 to bypass the fifth FET device ($Q_5$), providing both the first and second decoupling paths 122, 124, at the fifth FET device ($Q_5$) may help reduce the effects of impact ionization in the internal drain-source junction of the fifth FET device ($Q_5$) during the open state of the FET device stack 112. In the illustrated embodiment of FIG. 5, a control circuit 130 operates the FET device stack 112 in accordance with Table III above, which biases the drain contact, D of the fifth FET device ($Q_5$) at the bias voltage +$V_{bias}$ during the open state of the FET device stack 112 while the source contact, S, of the fifth FET device ($Q_5$) is not biased due to the DC block of the second decoupling capacitor 128. As a result, a voltage difference of around +$V_{bias}$ may be seen across the internal drain-source junctions of the fifth FET device ($Q_5$). In certain applications of the FET device stack 112, the voltage difference may be close to the drain-source voltage at which impact ionization occurs. Also, this voltage difference in combination with large signal conditions may cause impact ionization around the peaks of the time-variant input signal 42. In turn, the voltage difference may cause a leakage current to flow across the fifth FET device ($Q_5$) which in turn may cause a drop in the bias voltage, +$V_{bias}$, as seen by the first through fourth FET devices ($Q_1$-$Q_4$). This impact ionization problem can be suppressed by providing both the first and second decoupling paths 122, 124 at the first FET device ($Q_1$) thereby reducing the voltage drop across the internal drain-source junction of the fifth FET device ($Q_5$).

A control circuit 130 is operably associated with the gate contacts, G, of the FET devices 110 that switches the FET device stack 112 from and to the open state and closed state in accordance with Tables II and III above. In this embodiment, the control circuit 130 applies the bias voltage, $V_{stack}$, to the drain contact, D, of the fifth FET device ($Q_5$) which, in turn, also biases the drain contacts, D, and the source contacts, S of the first through fourth FET devices ($Q_1$-$Q_4$).

To decouple the body contact, B, of the fifth FET device ($Q_5$) in FIG. 5 a third decoupling path 132 may be provided in the stacked FET switch 108. In this embodiment, the third decoupling path 132 decouples the body contact, B, of the fifth FET device ($Q_5$) by short-circuiting the body contact, B. In this manner, the time-variant input signal 42 is prevented from loading the body contact, B, of the fifth FET device ($Q_5$).

Note that different combinations of the decoupling paths disclosed herein may be operably associated with either the first FET device ($Q_1$) or the fifth FET device ($Q_5$) so that the time-variant input signal 42 bypasses a desired part of a FET device stack in a stacked FET switch during the open state and/or to help reduce the effects of impact ionization. For example and referring again to FIG. 5, in other alternative embodiments, the FET device stack 112 may be connected to have the second decoupling path 124 and not the first decoupling path 122 so that the time-variant input signal 42 bypasses the FET device stack 112 from the drain contact, D, to the source contact, S, of the fifth FET device ($Q_5$). This configuration may be advantageous if impact ionization is not a problem or is kept within acceptable tolerance limits. Also, other embodiments may instead connect the first decoupling path 122 and the second decoupling path 124 to the first FET device ($Q_1$) so that the time-variant input signal 42 bypasses the FET device stack 112 from the drain contact, D, to the source contact, S, of the first FET device ($Q_1$) rather than the fifth FET device ($Q_5$). In this case, the first decoupling path 122 may be connected so that the FET device stack 112 is configured to bypass the FET device stack 112 from the drain contact, D, to the gate contact, G, of the first FET device ($Q_1$) during the open state. The second decoupling path 124 is connected to the first FET device ($Q_1$) so that the FET device stack 112 is configured to bypass the FET device stack 112 from the drain contact, D, to the source contact, S, of the first FET device ($Q_1$). Furthermore, in this case, the first capacitor 117 may be provided to be connected in series between the source contact, S, of the fifth FET device ($Q_5$) and the output terminal 120. Also, the fifth FET device ($Q_5$) could then be connected with a resistor, $R_{ds}$, across the drain contact, D, and source contact, S and help handle the load of the time-variant input signal 42 during the open state. These and other combinations for connecting one or more decoupling paths to decouple a desired portion of an FET device stack during the open state are within the scope of this disclosure.

Figure 6:
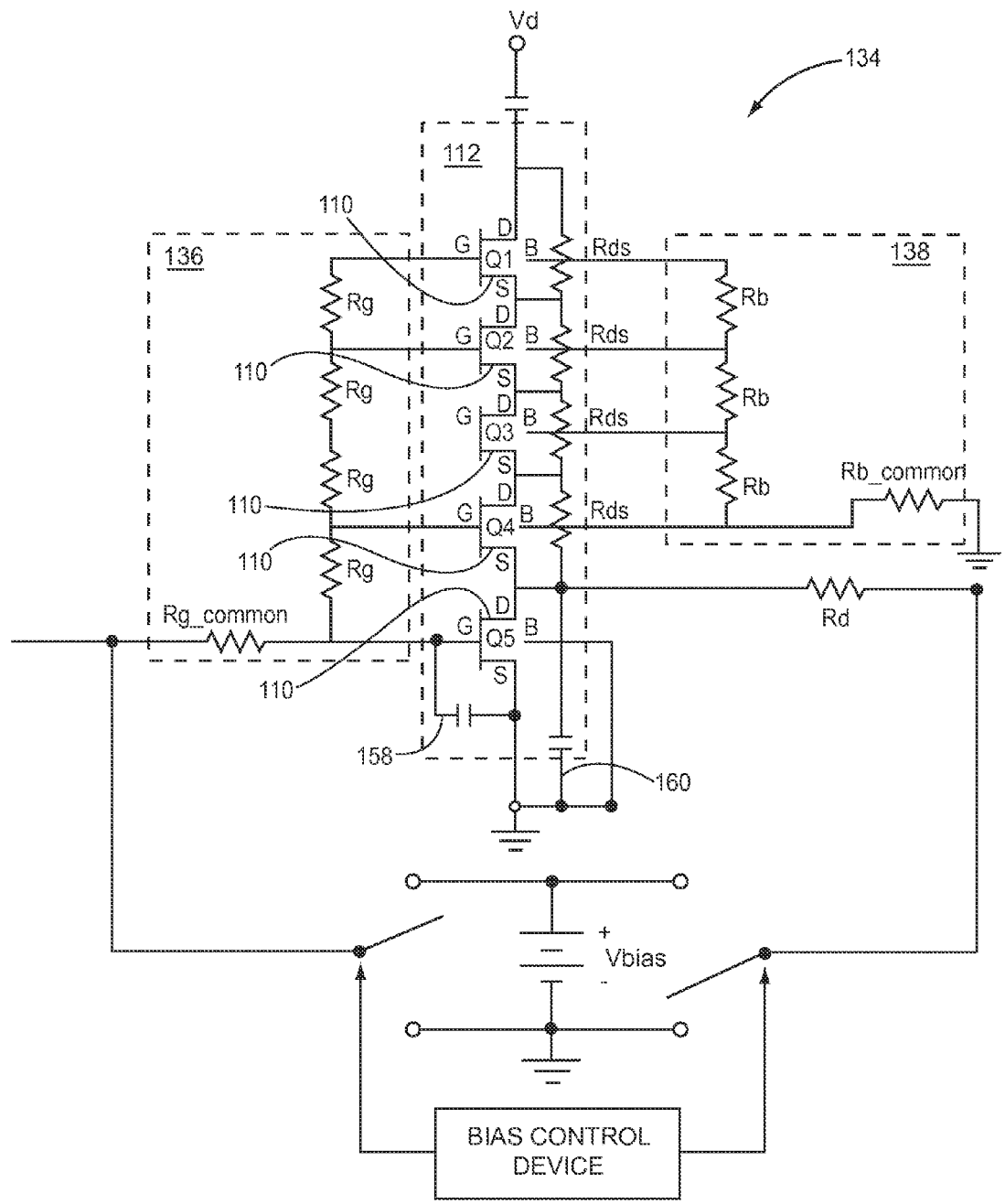
FIG. 6 illustrates still yet another embodiment of a stacked FET switch in accordance with this disclosure.

FIG. 6 is still yet another embodiment of a stacked FET switch 134. The stacked FET switch 134 is similar to the stacked FET switch 108 in FIG. 5. However, a resistive circuit 136, has each resistors, $R_g$, coupled between the gate contact, G, of one of the FET devices 110, and the gate contact, G, of another one of the FET devices 110. Similarly, a resistive circuit 138 has resistors, $R_b$, coupled between the body contact, B, of one of the FET devices 110, and the body contact, B, of another one of the FET devices 110. The circuit topology for the stacked FET switch 134 may be desirable, if the stacked FET switch 134 is being utilized to shunt an RF line of an RF circuit. One benefit of the illustrated topology of resistive circuits 136, 138 is that the open state loading of the resistors, $R_g$, and $R_b$, may be substantially reduced. As a result, the circuit topology of resistive circuits 136, 138 allows resistors $R_g$, and $R_b$ to be substantially reduced in size.

The embodiment illustrated in FIG. 6 has a first decoupling path 158 and a second decoupling path 160. The first decoupling path 158 is configured to bypass the time-variant input signal 42 from the gate contact, G, to the source contact, S of the fifth FET device ($Q_5$). In this example, the first decoupling path 158 is connected directly between the gate contact, G, and the source contact, S of the fifth FET device ($Q_5$). The second decoupling path 160 includes a decoupling capacitor that is configured to bypass the FET device stack 112 from the drain contact, D, to the source contact, S of the fifth FET device ($Q_5$) and is connected from the drain contact, D, to the output terminal, which is at ground.

Figure 7:
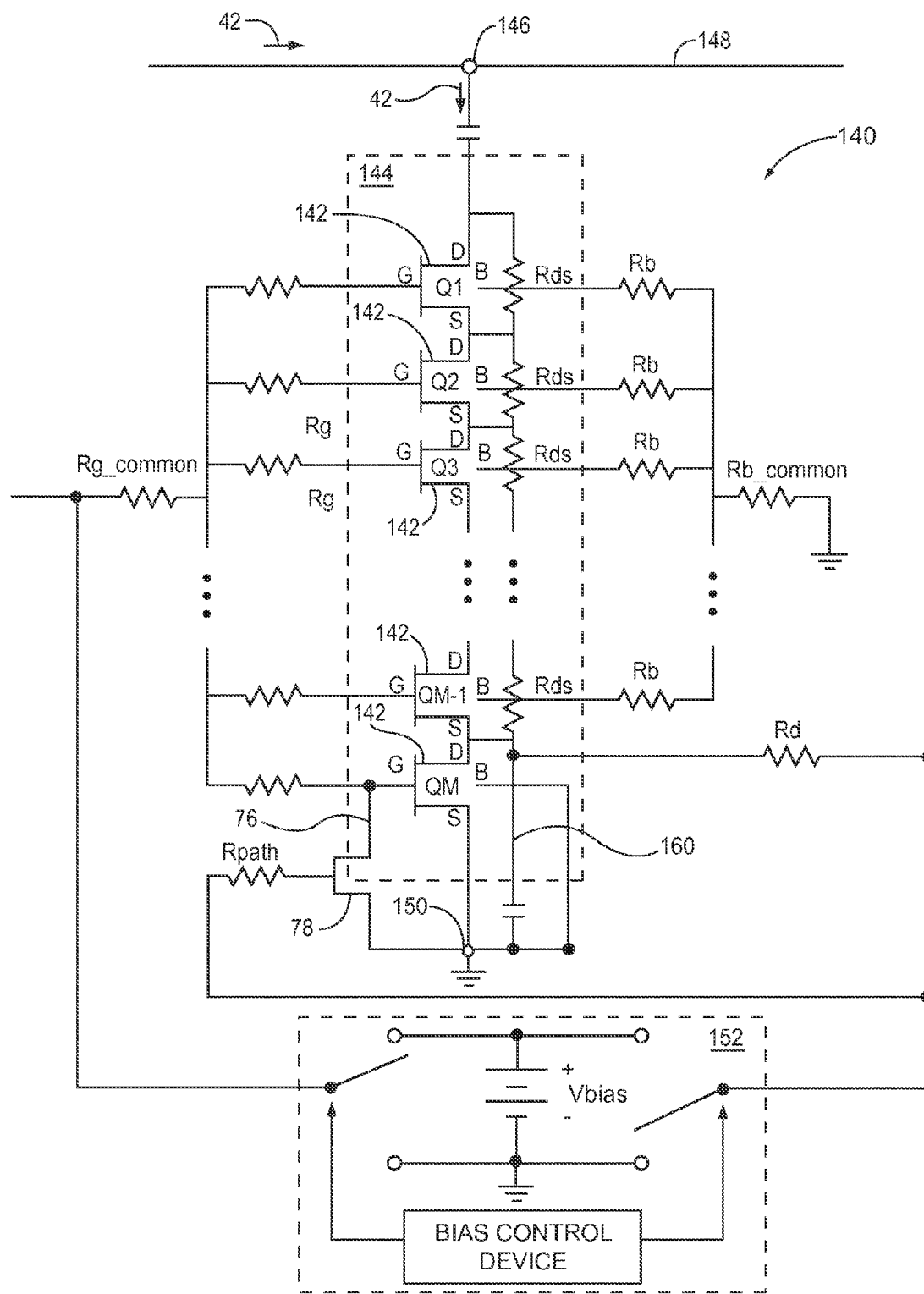
FIG. 7 illustrates still further embodiment of the stacked FET switch in accordance with this disclosure

Referring now to FIG. 7, a stacked FET switch 140 may have any plurality of FET devices (referred to generically as elements 142 and to a specific FET device as elements $Q_1$-$Q_M$) coupled in series to form an FET device stack 144. M is the number of FET devices 142 and may be any integer greater than 1. The FET device stack 144 in FIG. 7 is stacked from a first FET device ($Q_1$) to a last FET device ($Q_M$) and middle FET device ($Q_2$-$Q_{M-1}$) are connected in the FET device stack 144 between the first FET device ($Q_1$) to a last FET device ($Q_M$). In the illustrated embodiment, the stacked FET switch 140 has an input terminal 146 connected to a signal line 148 that transmits the time-variant input signal 42, which may be an RF signal. During the closed state, the FET device stack 144 shunts the signal line 148 and transmits the time-variant input signal 42 to the output terminal 150, which are connected to a reference voltage for the FET device stack 144, in this case ground. In the open state, the FET device stack 144 prevents the time-variant input signal 42 from being shunted to ground. A control circuit 152 provides a first voltage and second voltage, in accordance with Tables II and III, discussed above.

In this example, the last FET device ($Q_M$) has a first decoupling path 76 similar to the one illustrated in FIG. 3. The first decoupling path 76 has a first decoupling transistor 78 that is configured to bypass the time-variant input signal 42 from the gate contact, G, to the source contact, S of the last FET device ($Q_M$). The first decoupling path 76 is connected from the gate contact, G, of the last FET device ($Q_M$) directly to the output terminal 150. When the FET device stack 144 is in the open state, the first decoupling transistor 78 is turned on so that the time-variant input signal 42 bypasses the gate to source of the last FET device ($Q_M$). A second decoupling path 160 similar to the one illustrated in FIG. 6 is also provided. This second decoupling path 160 includes a decoupling capacitor that is configured to bypass the FET device stack 144 from the drain contact, D, to the source contact, S of the last FET device ($Q_M$) and is connected from the drain contact, D, of the last FET device ($Q_M$) to the output terminal 150.

Figure 8:
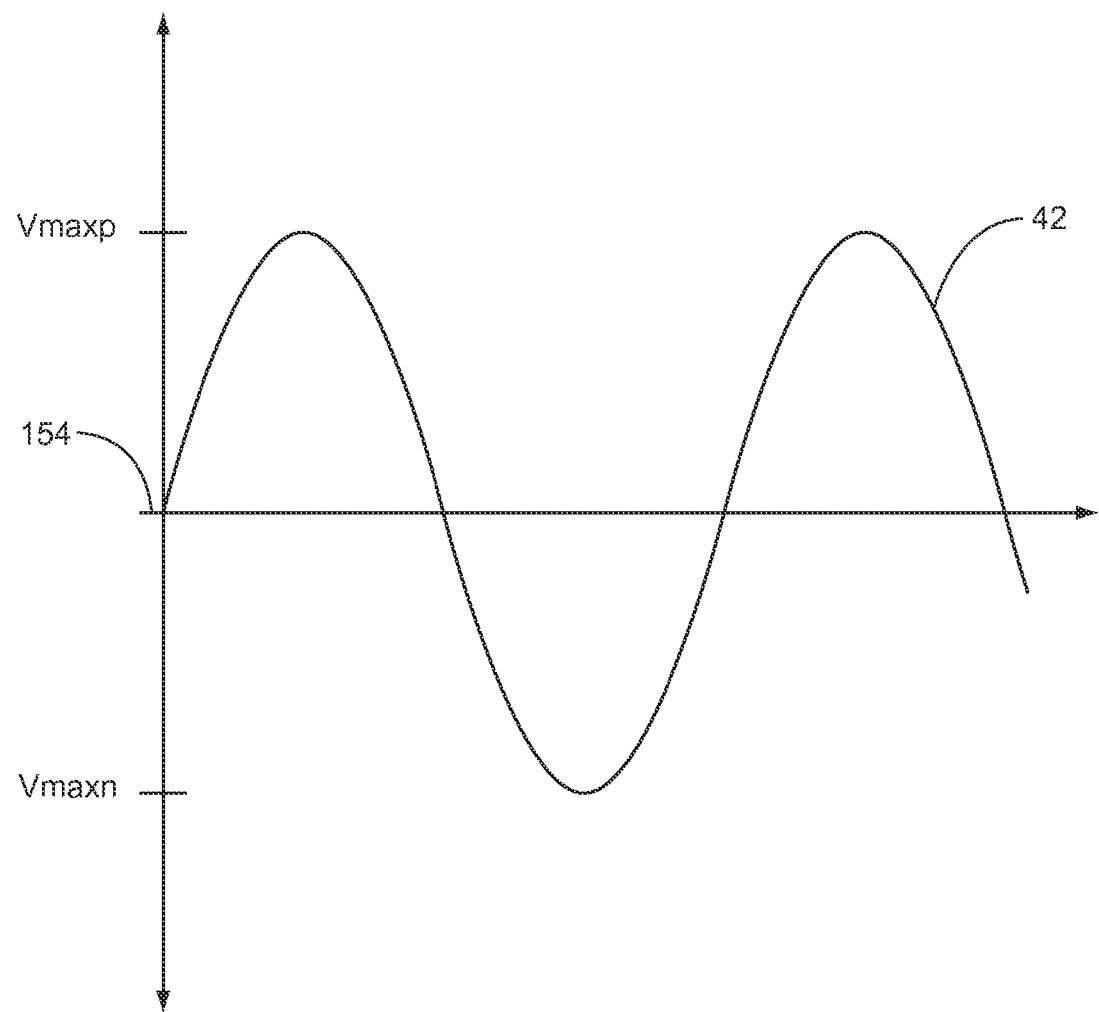
FIG. 8 illustrates one embodiment of a time-variant input signal for the stacked FET switch in FIG. 7.

Referring now to FIGS. 7 and 8, one type of time-variant input signal 42 is illustrated. The time-variant input signal 42 shown in FIG. 8 is a sinusoidal voltage having a maximum positive peak voltage, $V_{maxp}$, and a minimum negative peak voltage $V_{maxn}$, relative to a reference voltage, 154, in this case ground. The time-variant input signal 42 is illustrated as a simplified sinusoidal voltage to help discuss the operation of the stacked FET switch 140. Accordingly, the maximum positive peak voltage, $V_{maxp}$, and the minimum negative peak voltage $V_{maxn}$ have the same magnitude. Thus, the maximum peak voltage may be referred to as a maximum peak voltage, $V_{max}$. However, the time-variant input signal 42 may be any type of signal, such as, for example an RF signal, in which the time-variant input signal 42 would be more or even less complex than the signal shown in FIG. 8, may actually consist of a plurality of combined signals, and may not be symmetrical. For example, the maximum positive peak voltage, $V_{maxp}$, and the minimum negative peak voltage $V_{maxn}$ may have a different magnitude in the positive and negative cycles. Some time-variant input signals 42 may not have either a positive or a negative cycle and thus may be unicyclical and others may actually not be periodic at all. These and other considerations should be taken into account when determining maximum peak voltage, $V_{max}$ as would be apparent to one of ordinary skill in the art, in light of this disclosure.

The plurality of FET devices 142 in FIG. 7 may each be associated with a reverse biased pinch-off voltage, ($-V_p$) and a breakdown voltage, $-V_{Break}$. The pinch-off voltage, $(-V_p)$, of a depletion mode FET device 142 is the reverse bias voltage at the gate contact, G, relative to a voltage of the source contact, S, at which the FET device 142 is opened. If a reverse bias less than or equal to the pinch-off voltage, $(-V_p)$, is applied between the gate contact, G, and the source contact, S, of the FET device 142, a channel of the FET device 142 is pinched off and the FET device 142 is deactivated. If the FET devices have congruent drains and sources, the pinch-off voltage, $(-V_p)$, is applicable to the activation voltage from the gate contact, G, to the source contact, S for the FET device 142, as well. The breakdown voltage, $-V_{Break}$, is the negative voltage between the drain contact, D, and the gate contact, G at which the FET device 142 begins to conduct when in the open state. In other words, if a negative voltage equal to or greater than the breakdown voltage, $-V_{Break}$, is applied between the drain contact, D, and the gate contact, G, the FET device 142 breaks down and begins to conduct. In FIG. 7, the plurality of FET devices 142 all have essentially the same characteristics and thus are associated with the same pinch-off voltage, $(-V_p)$, and breakdown voltages, $-V_{Break}$. However, as discussed above, in other embodiments, the characteristics of the FET devices 142 may be different and thus each may be associated with different pinch-off voltages and/or breakdown voltages.

Figure 9:
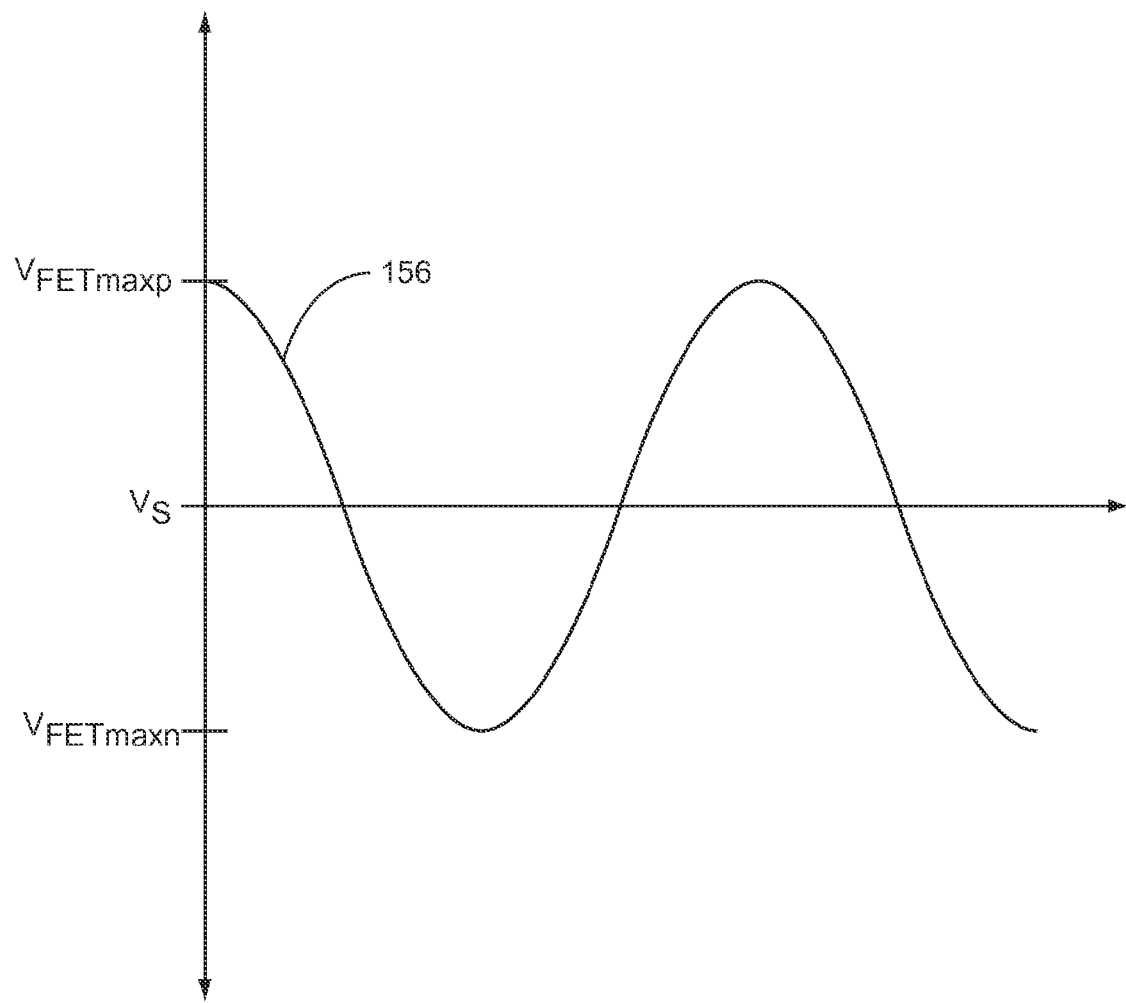
FIG. 9 illustrates a voltage at each of the drain contacts relative to the source contacts of the first FET devices to the second-to-last FET device when an FET device stack in FIG. 7 is in an open state.

Referring now to FIGS. 7 and 9, FIG. 9 is a graph of a voltage signal 156 at the drain contacts, D of the first through to the second-to-last FET devices $(Q_1-Q_{M-1})$ relative to their source contact, S, during the open state of the FET device stack 144. Note that the last FET device $(Q_M)$ has been decoupled during the open state. A first decoupling path 158 and a second decoupling path 160 are configured to pass the time-variant input signal 42 during the open state. The first decoupling path 158 is connected directly to ground so that the FET device stack 144 is configured to bypass the FET device stack 144 from the drain contact, D, of the last FET device $(Q_M)$ to the gate contact, G, of the last FET device $(Q_M)$. The second decoupling path 160 is also connected directly to ground so that the FET device stack 144 is configured to bypass the FET device stack 144 from the drain contact, D, of the last FET device $(Q_M)$ to the source contact, S, of the last FET device $(Q_M)$. Thus, the voltage of the time-variant input signal 42 is not dropped across the last FET device $(Q_M)$.

As discussed above, different decoupling paths may be connected to the FET device stack 144 to bypass a desired portion of the FET device stack 144 during the open state. For example, in alternative embodiments, the first FET device $(Q_1)$ may be decoupled from the drain contact, D, to the gate contact, G, and/or from the drain contact, D, to the source contact, S, during the open state while the last FET device $(Q_M)$ remains coupled and helps handle the voltage load of the time-variant input signal 42. Alternatively, the FET device stack 144 may only be decoupled from the gate contact, G, to the source contact, S, of the last FET device $(Q_M)$, similar to the embodiment explained above for FIG. 2. In this case, if the last FET device $(Q_M)$ is only decoupled from the gate contact, G, to the source contact, S, and if we assume that the FET devices 142 have congruent drain and sources that have similar impedance characteristics, the voltage drop of the time-variant input signal 42 across the last FET device devices $(Q_M)$ for the time-variant input signal 42 is about half of the voltage drop across each of the other FET devices $(Q_1-Q_{M-1})$ during the open state.

In another alternative embodiment, the FET device stack 144 may only be decoupled from the drain contact, D, to the gate contact, G, of the first FET device $(Q_1)$ similar to the embodiment described in FIG. 4. In this case, if the first FET device $(Q_1)$ is only decoupled from the drain contact, D, to the gate contact, G, and if we assume that the FET devices 142 have congruent drains and sources, the voltage drop of the time-variant input signal 42 across the first FET device devices $(Q_1)$ for the time-variant input signal 42 is about half of the voltage drop across each of the other FET devices $(Q_2-Q_M)$. In the embodiment illustrated in FIG. 7, however, the last FET device $(Q_M)$ is decoupled from the drain contact, D, to the source contact, S by the second decoupling path 160 and thus none or very little of the voltage of the time-variant input signal 42 is dropped across last FET device $(Q_M)$.

The voltage drop of the time-variant input signal 42 may be distributed evenly across each of the drain to gate and gate to source junctions of the other FET devices $(Q_1-Q_{M-1})$ during the open state. This helps to maximize the load handling capabilities of the FET device stack 144 assuming that the FET devices have congruent drains and sources that have similar impedance characteristics. Finally, in certain applications, the last FET device $(Q_M)$ may be formed to be wider than the other FET devices $(Q_1-Q_{M-1})$ to help suppress leakage currents caused by the voltage stress from the time-variant input signal 42 during the open state. Similarly, for embodiments as in FIG. 4 in which the first FET device $(Q_1)$ has been decoupled, the first FET device $(Q_1)$ may be formed to be wider than the other FET devices $(Q_2-Q_M)$ to help suppress leakage currents.

Referring again to FIGS. 7 and 9, note that the voltage signal 156 in FIG. 9 is measured relative to the source contact, S, of the FET devices $(Q_1-Q_{M-1})$ and not to ground. The voltages signal for each of the drain contacts, D, of the FET devices $(Q_1-Q_{M-1})$ relative to ground, is clearly different for each of the FET devices $(Q_1-Q_{M-1})$. The FET devices $(Q_1-Q_{M-1})$ positioned higher in the stack would have a drain voltage with greater positive and negative voltage peaks plus a bias voltage, $+V_{bias}$ relative to ground during the open state of the FET device stack 144. The drain voltage of the second-to-last FET device $(Q_{M-1})$ would be essentially the same as the time-variant input signal 42 (shown in FIG. 7) plus a biasing voltage, $+V_{bias}$, relative to ground during the open state. However, since the time-variant input signal 42 may be evenly distributed across each of the FET devices $(Q_1-Q_{M-1})$, the drain voltages are relatively uniform relative to their source contact, S. Also, the biasing voltage, $+V_{bias}$, cancels out for voltage signal 156 since both of the drain contact, D, and the source contact, S, of the FET devices $(Q_1-Q_{M-1})$ are biased by the biasing voltage, $+V_{bias}$, during the open state.

As illustrated, the voltage signal 156 has a maximum positive peak voltage, $V_{FETmaxp}$, and the minimum negative peak voltage $V_{FETmaxn}$. Since, in this case, the voltage signal is symmetrical, the magnitude of the maximum peak voltage, $|V_{FETmax}|$, can be represented as:

$$|V_{FETmax}| = \frac{V_{max}}{M-1}$$

The integer one (1) is subtracted from M because, as discussed above, in this embodiment, last FET device $(Q_M)$ has been completely decoupled from the stack with respect to the time-variant input signal 42 during the open state. However, if in the alternative, the FET device stack 144 is only decoupled from the gate contact, G, to the source contact, S, of the last FET device ($Q_M$), and then the last FET device ($Q_M$) may contribute half of its load handling capabilities to the FET device stack 144. Accordingly, in this case, the integer one (1) would be replaced by one-half $$\left(\frac{1}{2}\right).$$

Figure 10:
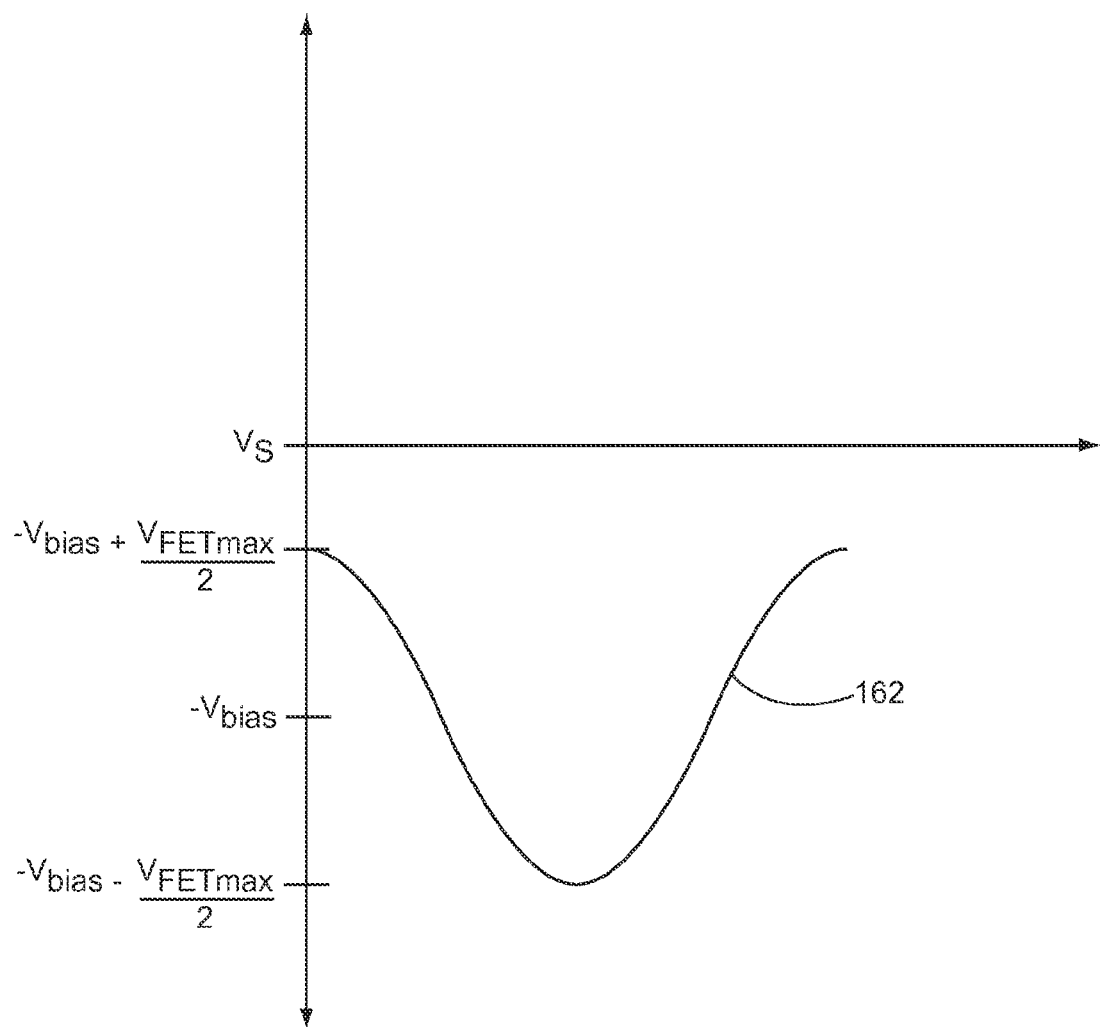
FIG. 10 illustrate a voltage of each of the gate contacts relative to the source contacts of the first FET devices to the second-to-last FET device when the FET device stack in FIG. 7 is in the open state.

Referring now to FIG. 7 and FIG. 10, FIG. 10 illustrates a voltage signal 162 at the gate contact, G, of each of the FET devices ($Q_1$-$Q_{M-1}$), relative to their source contact, S, during the open state of the FET device stack 144. Note that the gate contact, G, of each of the middle FET devices ($Q_2$-$Q_{M-1}$) appears negatively biased at, $-V_{bias}$, since the drain and source contacts, D, S, of each of the FET devices ($Q_1$-$Q_{M-1}$) are positively biased by the first voltage, $+V_{bias}$. For each of the FET devices ($Q_1$-$Q_{M-1}$) shown in FIG. 6, half of the voltage drop for the voltage signal 156 (shown in FIG. 9) occurs between the drain contact, D, and the gate contact, G, and the other half occurs between the gate contact, G, and the source contact, S. Consequently, the voltage signal 162 is centered at the negative bias, $-V_{bias}$, and has a maximum positive-cycle peak voltage, $$-V_{bias} + \frac{V_{FETmax}}{2},$$

and a maximum negative-cycle peak voltage, $$-V_{bias} - \frac{V_{FETmax}}{2}$$

relative to the source contact, S. To maintain the FET devices ($Q_1$-$Q_{M-1}$) in the open state, the voltage signal 162 must not be greater than the pinch-off voltage, $(-V_p)$, during the positive cycle. The upper limit of the maximum peak voltage, $$-V_{bias} + \frac{V_{FETmax}}{2},$$

can thus be expressed as:

$$-V_{bias} + \frac{V_{FETmax}}{2} = (-V_p)$$

Since the voltage between the drain contacts, D, and the gate contacts, G, at the minimum peak voltage, $$-V_{bias} - \frac{V_{FETmax}}{2},$$

cannot exceed the negative breakdown voltage, $-V_{Break}$, the lower limit of the minimum peak voltage, $$-V_{bias} - \frac{V_{FETmax}}{2},$$

can be expressed as:

$$-V_{bias} - \frac{V_{FETmax}}{2} = -V_{Break}$$

From these two equations, the highest allowable value of the maximum peak voltage, $V_{FETmax}$, can be solved as $$V_{FETmax} = |V_{Break}| + (-V_p)$$

Also, from the two equations, we can also solve for the magnitude of the first voltage, $V_{bias}$, relative to ground which may be expressed as:

$$V_{bias} = \frac{|V_{Break}| + (-V_p)}{2}$$

If the maximum peak voltage, $V_{max}$, of the time-variant input signal 42 is reaches a maximum voltage, $V_{pk}$, then the number, M, of FET devices 142 needed to safely utilize the FET device stack 144 may be expressed as:

$$M \geq \frac{V_{pk}}{(|V_{Break}| + (-V_p))} + 1$$

The number M of FET devices 142 thus may determine the maximum rated voltage that can be handled by the FET device stack 144.

It should be noted that the equations shown above are estimations for the described values of the stacked FET switch 140 illustrated in FIG. 6. In actual practice, these values may vary from the aforementioned equations as a result of non-ideal behavior of the electronic components in the stacked FET switch 140. In other embodiments, the relationships described by the aforementioned equations may be different depending on the particular circuit topology and electronic components utilized for the stacked FET switch 140. For example, the aforementioned equations have been determined under the assumption that the FET devices 142 are depletion mode type FET devices 142. However, enhancement mode type FET devices 142 may also be utilized in the stacked FET switch 140. In addition, it was assumed that the FET devices 142 have congruent drains and sources and in the alternative, one or more of the FET devices 142 may not have congruent drains and sources. Also, as discussed above, alternative embodiments may not completely decouple the first FET device ($Q_1$) and the last FET device ($Q_M$) and thus, for example, the first FET device ($Q_1$) and the last FET device ($Q_M$) may contribute half of their load handling capabilities to the FET device stack 144. One of ordinary skill in the art would be able to reformulate the relationships expressed by the aforementioned equations in accordance with non-ideal circuit behavior and the particular circuit topology and electronic components utilized to form the stacked FET switch 140 in light of this disclosure.

Those skilled in the art will recognize improvements and modifications to the preferred embodiments of the present disclosure. All such improvements and modifications are considered within the scope of the concepts disclosed herein and the claims that follow.

What is claimed is:

1. A stacked field effect transistor (FET) switch for a time-variant input signal, the stacked FET switch comprising:
a FET device stack operable in an open state and in a closed state, the FET device stack comprising a plurality of FET devices coupled in series to form the FET device stack;
each of the plurality of FET devices having a gate contact, a drain contact, and a source contact, the plurality of FET devices including a first FET device wherein either the drain contact or the source contact of the first FET device is at a first end of the FET device stack;
a first decoupling path configured to pass the time-variant input signal during the open state of the FET device stack, the first decoupling path being connected to the FET device stack such that a voltage drop of the time-variant input signal bypasses the FET device stack from the drain contact of the first FET device to the source contact of the first FET device during the open state of the FET device stack.

2. The stacked FET switch of claim 1, wherein the first decoupling path further comprises a capacitor.

3. The stacked FET switch of claim 2, wherein the capacitor is configured to pass the time-variant input signal during the open state.

4. The stacked FET switch of claim 1, further comprising:
a control circuit operably associated to switch the FET device stack to and from the open state and the closed state; and
the first decoupling path comprising a transistor, the transistor being configured to pass the time-variant input signal during the open state of the FET device stack by the control circuit wherein the transistor is operably associated with the control circuit such that the transistor is on during the open state and off during the closed state.

5. The stacked FET switch of claim 1, wherein the drain contact of the first FET device is at the first end and the first decoupling path is connected to the FET device stack such that the voltage drop of the time-variant input signal bypasses the FET device stack from the drain contact of the first FET device to the source contact of the first FET device.

6. The stacked FET switch of claim 5, wherein the first decoupling path is connected to the FET device stack such that the voltage drop of the time-variant input signal bypasses the FET device stack from the drain contact of the first FET device to the source contact of the first FET device by being directly connected between the drain contact of the first FET device and the source contact of the first FET device.

7. The stacked FET switch of claim 5, further comprising:
an input terminal coupled to the first end of the FET device stack to receive the time-variant input signal; and
the first decoupling path being connected to the FET device stack such that the voltage drop of the time-variant input signal bypasses the FET device stack from the drain contact of the first FET device to the source contact of the first FET device by being directly connected between the input terminal and the source contact of the first FET device.

8. The stacked FET switch of claim 1, wherein the source contact of the first FET device is at the first end and the first decoupling path is connected to the FET device stack such that the voltage drop of the time-variant input signal bypasses the FET device stack from the source contact of the first FET device to the drain contact of the first FET device.

9. The stacked FET switch of claim 8, wherein the first decoupling path is connected to the FET device stack such that the voltage drop of the time-variant input signal bypasses the FET device stack from the source contact of the first FET device to the drain contact of the first FET device by being directly connected between the source contact of the first FET device and the drain contact of the first FET device.

10. The stacked FET switch of claim 8, wherein the first decoupling path is connected to the FET device stack such that the voltage drop of the time-variant input signal bypasses the FET device stack from the source contact of the first FET device to the drain contact of the first FET device by being directly connected between the drain contact of the first FET device and a ground node.

11. The stacked FET switch of claim 1, further comprising:
an input terminal for receiving the time-variant input signal;
an output terminal; and
the FET device stack being connected between the input terminal and the output terminal.

12. The stacked FET switch of claim 1, further comprising:
each of the plurality of FET devices having a body contact, wherein the plurality of FET devices include the first FET device and one or more additional FET devices;
a resistive circuit coupled to each of the body contacts of the one or more additional FET devices, the resistive circuit providing a high resistance at each of the body contacts of the one or more additional FET devices so as to render parasitic capacitances between the body contact and the drain and source contacts of each of the one or more additional FET devices negligible.

13. The stacked FET switch of claim 1, further comprising:
a resistive circuit coupled to each of the gate contacts of the plurality of FET devices, the resistive circuit providing a high resistance at each of the gate contacts of the plurality of FET devices so as to render parasitic capacitances between the gate contact and the drain and source contacts of each of the plurality of FET devices negligible.

14. The stacked FET switch of claim 1, further comprising:
wherein the plurality of FET devices have the first FET device and one or more additional FET devices;
a control circuit operably associated with the FET device stack, the control circuit being configured to:
bias the gate contact of each of the plurality of FET devices at a first voltage such that the FET device stack operates in the closed state, wherein the first voltage is positive relative to a reference voltage;
bias the gate contact of each of the plurality of FET devices at a second voltage; and
bias the drain contact and source contact of each of the one or more additional FET devices at the first voltage, such that the FET device stack operates in the open state, wherein the second voltage is less than the first voltage and is substantially non-negative relative to the reference voltage.

15. The stacked FET switch of claim 14, wherein the control circuit is further configured to bias the drain contact and source contact of each of the one or more additional FET devices at the second voltage during the closed state of the FET device stack.

16. The stacked FET switch of claim 15, wherein the first decoupling path is configured to block DC bias voltages.

17. The stacked FET switch of claim 14, wherein the drain contact and source contact of each of the plurality of FET devices are coupled so that biasing the drain contact and the source contact of each of the one or more additional FET devices biases the drain contact or the source contact of the first FET device not at the first end during the open state.

18. A stacked field effect transistor (FET) switch for a time-variant input signal, the stacked FET switch comprising:
 a FET device stack operable in an open state and in a closed state, the FET device stack comprising a plurality of FET devices coupled in series to form the FET device stack, each of the plurality of FET devices having a gate contact, a drain contact, and a source contact and the FET device stack having at least a first end FET device, a second end FET device, and one or more middle FET devices connected between the first end FET device and the second end FET device, wherein the drain contact of the first end FET device is at a first end of the FET device stack and the source contact of the second end FET device is at a second end of the FET device stack; and
 a first decoupling path configured to pass the time-variant input signal during the open state of the FET device stack, the first decoupling path being connected to the FET device stack such that a voltage drop of the time-variant input signal bypasses the FET device stack from the drain contact of one of the end FET devices to the source contact of the one of the end FET devices, during the open state of the FET device stack.

19. The stacked FET switch of claim 18, further comprising:
 a control circuit operably associated with the FET device stack, the control circuit being configured to:
  bias the gate contacts of each of the plurality of FET devices at a first voltage such that the FET device stack operates in the closed state, wherein the first voltage is positive relative to a reference voltage;
  bias the gate contact of each of the plurality of FET devices at a second voltage; and
  bias the drain contact and the source contact of each of the one or more middle FET devices and the other one of the end FET devices at the first voltage, such that the FET device stack operates in the open state, wherein the second voltage is less than the first voltage and substantially non-negative relative to the reference voltage.

20. The stacked FET switch of claim 18, further comprising a second decoupling path and a control circuit, wherein:
 the one of the end FET devices is the second end FET device;
 the other one of the end FET devices is the first end FET device;
 the first decoupling path comprises a transistor, the control circuit being operable to turn on the transistor during the open state so that the first decoupling path is configured to bypass the FET device stack from the source contact of the second end FET device to the drain contact of the second end FET device during the open state; and
 the second decoupling path is configured to bypass the FET device stack from the gate contact to the source contact of the second end FET device, wherein the second decoupling path comprises a decoupling capacitor.

21. The stacked FET switch of claim 19, wherein the control circuit is further configured to bias the drain contact and the source contact of each of the one or more middle FET devices and the first end FET device at the second voltage during the closed state of the FET device stack.

22. The stacked FET switch of claim 1, further comprising a second decoupling path configured to pass the time-variant input signal during the open state of the FET device stack, the second decoupling path being connected to the FET device stack such that the voltage drop of the time-variant input signal bypasses the FET device stack from the either the drain contact or the source contact of the first FET device at the first end of the FET device stack to the gate contact of the first FET device during the open state of the FET device stack.

23. The stacked FET switch of claim 22 wherein the either the drain contact or the source contact of the first FET device at the first end of the FET device stack is the drain contact of the first FET device at the first end of the FET device stack.

24. The stacked FET switch of claim 22 wherein the either the drain contact or the source contact of the first FET device at the first end of the FET device stack is the source contact of the first FET device at the first end of the FET device stack.

* * * * *